(12) United States Patent
Chen et al.

(10) Patent No.: US 12,170,207 B2
(45) Date of Patent: Dec. 17, 2024

(54) STACKED SEMICONDUCTOR DEVICES AND METHODS OF FORMING SAME

(71) Applicant: Taiwan Semiconductor Manufacturing Co., Ltd., Hsinchu (TW)

(72) Inventors: Hsien-Wei Chen, Hsinchu (TW); Der-Chyang Yeh, Hsinchu (TW); Li-Hsien Huang, Zhubei (TW)

(73) Assignee: TAIWAN SEMICONDUCTOR MANUFACTURING COMPANY LTD., Hsin-Chu (TW)

( * ) Notice: Subject to any disclaimer, the term of this patent is extended or adjusted under 35 U.S.C. 154(b) by 0 days.

(21) Appl. No.: 18/447,460

(22) Filed: Aug. 10, 2023

(65) Prior Publication Data

US 2023/0386864 A1    Nov. 30, 2023

Related U.S. Application Data

(60) Continuation of application No. 17/876,300, filed on Jul. 28, 2022, now Pat. No. 11,823,912, which is a
(Continued)

(51) Int. Cl.
*H01L 21/56* (2006.01)
*H01L 23/00* (2006.01)
(Continued)

(52) U.S. Cl.
CPC ........ *H01L 21/563* (2013.01); *H01L 23/3171* (2013.01); *H01L 23/3185* (2013.01); *H01L 24/00* (2013.01); *H01L 24/03* (2013.01); *H01L 24/05* (2013.01); *H01L 24/06* (2013.01); *H01L 24/11* (2013.01); *H01L 25/0657* (2013.01);
(Continued)

(58) Field of Classification Search
None
See application file for complete search history.

(56) References Cited

U.S. PATENT DOCUMENTS 4,149,302 A    4/1979  Cook
4,621,045 A   11/1986  Goodner
(Continued)

FOREIGN PATENT DOCUMENTS

CN        102280423 A    12/2011

*Primary Examiner* — Daniel Whalen
(74) *Attorney, Agent, or Firm* — Slater Matsil, LLP

(57) ABSTRACT

Stacked semiconductor devices and methods of forming the same are provided. Contact pads are formed on a die. A passivation layer is blanket deposited over the contact pads. The passivation layer is subsequently patterned to form first openings, the first openings exposing the contact pads. A buffer layer is blanket deposited over the passivation layer and the contact pads. The buffer layer is subsequently patterned to form second openings, the second opening exposing a first set of the contact pads. First conductive pillars are formed in the second openings. Conductive lines are formed over the buffer layer simultaneously with the first conductive pillars, ends of the conductive lines terminating with the first conductive pillars. An external connector structure is formed over the first conductive pillars and the conductive lines, the first conductive pillars electrically coupling the contact pads to the external connector structure.

20 Claims, 19 Drawing Sheets

Related U.S. Application Data continuation of application No. 17/101,608, filed on Nov. 23, 2020, now Pat. No. 11,430,670, which is a continuation of application No. 16/670,123, filed on Oct. 31, 2019, now Pat. No. 10,847,383, which is a continuation of application No. 16/227,697, filed on Dec. 20, 2018, now Pat. No. 10,510,562, which is a division of application No. 14/788,258, filed on Jun. 30, 2015, now Pat. No. 10,163,661.

(51) Int. Cl.
  *H01L 23/31* (2006.01)
  *H01L 25/065* (2023.01)
  *H01L 25/10* (2006.01)

(52) U.S. Cl.
  CPC .......... *H01L 23/3192* (2013.01); *H01L 24/81* (2013.01); *H01L 25/105* (2013.01); *H01L 2224/02311* (2013.01); *H01L 2224/02375* (2013.01); *H01L 2224/034* (2013.01); *H01L 2224/0345* (2013.01); *H01L 2224/0346* (2013.01); *H01L 2224/0347* (2013.01); *H01L 2224/0362* (2013.01); *H01L 2224/0401* (2013.01); *H01L 2224/05022* (2013.01); *H01L 2224/0508* (2013.01); *H01L 2224/05124* (2013.01); *H01L 2224/05147* (2013.01); *H01L 2224/05548* (2013.01); *H01L 2224/05572* (2013.01); *H01L 2224/0616* (2013.01); *H01L 2224/12105* (2013.01); *H01L 2224/16227* (2013.01); *H01L 2224/94* (2013.01); *H01L 2225/0651* (2013.01); *H01L 2225/06568* (2013.01); *H01L 2225/1047* (2013.01); *H01L 2225/1058* (2013.01)

(56) References Cited

U.S. PATENT DOCUMENTS

| | | |
|---|---|---|
| 5,136,364 A | 8/1992 | Byrne |
| 5,656,863 A | 8/1997 | Yasunaga et al. |
| 5,943,597 A | 8/1999 | Kleffner et al. |
| 6,001,538 A | 12/1999 | Chen et al. |
| 6,077,726 A | 6/2000 | Mistry et al. |
| 6,479,900 B1 | 11/2002 | Shinogi et al. |
| 6,518,092 B2 | 2/2003 | Kikuchi |
| 6,642,136 B1 | 11/2003 | Lee et al. |
| 6,958,546 B2 | 10/2005 | Fan et al. |
| 7,479,690 B2 | 1/2009 | Shiraishi |
| 7,994,045 B1 | 8/2011 | Huemoeller et al. |
| 8,492,891 B2 | 7/2013 | Lu et al. |
| 9,502,365 B2 | 11/2016 | Han et al. |
| 10,163,661 B2 | 12/2018 | Chen et al. |
| 2002/0005568 A1 | 1/2002 | Kikuchi |
| 2003/0199159 A1 | 10/2003 | Fan et al. |
| 2003/0218246 A1 | 11/2003 | Abe et al. |
| 2004/0007779 A1 | 1/2004 | Arbuthnot et al. |
| 2005/0266667 A1 | 12/2005 | Huang |
| 2007/0020999 A1 | 1/2007 | Shiraishi |
| 2008/0227237 A1 | 9/2008 | Lin et al. |
| 2011/0074047 A1* | 3/2011 | Pendse .................. H01L 21/563 257/782 |
| 2011/0193232 A1* | 8/2011 | Chen .................... H01L 23/3192 438/668 |
| 2011/0254159 A1 | 10/2011 | Hwang et al. |
| 2011/0304042 A1 | 12/2011 | Lin et al. |
| 2012/0007228 A1* | 1/2012 | Lu ........................... H01L 24/16 257/E21.582 |
| 2014/0110856 A1 | 4/2014 | Lin |
| 2015/0030134 A1 | 1/2015 | Mrusek |
| 2015/0069623 A1* | 3/2015 | Tsai ....................... H01L 23/31 257/774 |
| 2015/0123269 A1 | 5/2015 | Chen et al. |
| 2015/0279777 A1 | 10/2015 | Hsu |
| 2016/0233182 A1 | 8/2016 | Hu |

\* cited by examiner

STACKED SEMICONDUCTOR DEVICES AND METHODS OF FORMING SAME

CROSS-REFERENCE TO RELATED APPLICATIONS

This application is a continuation of U.S. patent application Ser. No. 17/876,300, filed on Jul. 28, 2022, entitled "Stacked Semiconductor Devices and Methods of Forming Same," which is a continuation of U.S. patent application Ser. No. 17/101,608, filed on Nov. 23, 2020, entitled "Stacked Semiconductor Devices and Methods of Forming Same," now U.S. Pat. No. 11,430,670, issued on Aug. 30, 2022, which is a continuation of U.S. patent application Ser. No. 16/670,123, filed on Oct. 31, 2019, entitled "Stacked Semiconductor Devices and Methods of Forming Same," now U.S. Pat. No. 10,847,383, issued on Nov. 24, 2020, which is a continuation of U.S. patent application Ser. No. 16/227,697, filed on Dec. 20, 2018, entitled "Stacked Semiconductor Devices and Methods of Forming Same," now U.S. Pat. No. 10,510,562, issued on Dec. 17, 2019, which is a divisional of U.S. patent application Ser. No. 14/788,258, filed on Jun. 30, 2015, entitled "Stacked Semiconductor Devices and Methods of Forming Same," now U.S. Pat. No. 10,163,661, issued on Dec. 25, 2018, which applications are incorporated herein by reference in their entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, wafers/dies are stacked on top of one another and are interconnected using through connections such as through vias (TVs). Some of the benefits of 3DICs, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
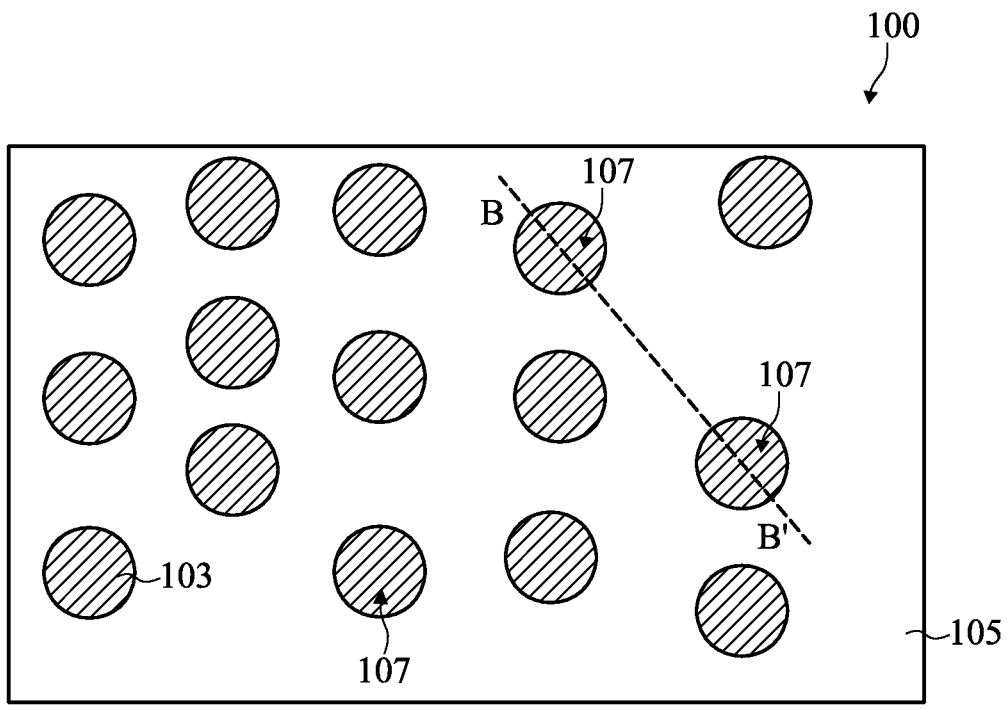
FIGS. 1A, 1B, 2A, 2B, 3A, 3B, 4A, 4B, 5A and 5B are top and cross-sectional views of various processing steps during fabrication of a semiconductor die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a stacked device, such as a package-on-package (PoP) device, a chip-on-package (CoP) device, or the like. Various intermediate stages of forming a stacked device are illustrated. Some variations of the embodiments are discussed.

FIGS. 1A-5B are top and cross-sectional views of various processing steps during fabrication of a semiconductor die 100 in accordance with some embodiments, wherein an "A" figure represents a top view and a "B" figure represents a cross-sectional view along the B-B' line of the respective "A" figure.

Figure 1B:
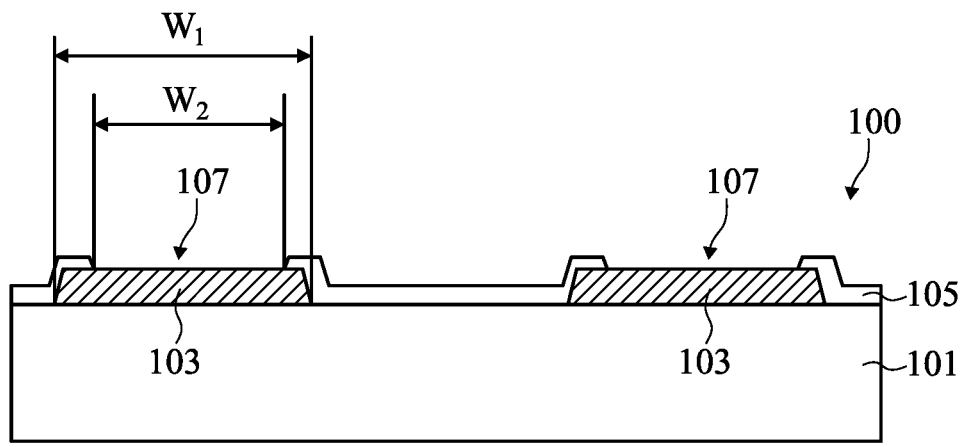

Turning first to FIGS. 1A and 1B, the semiconductor die 100 is illustrated. In the illustrated embodiment, the semiconductor die 100 comprises a portion of a processed wafer 101 having contact pads 103 formed thereon, and a passivation layer 105 formed over the processed wafer 101 and the contact pads 103. The passivation layer 105 is patterned to form openings 107 in the passivation layer 105 and expose portions of the contact pads 103.

In some embodiments, the processed wafer 101 comprises a substrate, various active and passive devices on the substrate, and various metallization layers over the substrate, which are not explicitly illustrated in FIGS. 1A and 1B as their inclusion is not necessary for understanding various embodiments described below. The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The metallization layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spin-on coating, chemical vapor deposition (CVD), plasma enhanced CVD (PECVD), or the like.

In some embodiments, interconnect structures may be formed in the ILD/IMDs using, for example, a damascene process, a dual damascene process, or the like. The ILD/IMDs may be patterned using photolithography techniques to form trenches and vias. The interconnect structures are formed by depositing a suitable conductive material in the trenches and the vias of the ILD/IMDs using various deposition and plating methods, or the like. In addition, the interconnect structures may include one or more barrier/adhesion layers to protect the ILD/IMDs from diffusion and metallic poisoning. The one or more barrier/adhesion layers may comprise titanium, titanium nitride, tantalum, tantalum nitride, or other alternatives. The barrier layer may be formed using physical vapor deposition (PVD), atomic layer deposition (ALD), sputtering, or the like. The conductive material of the interconnect structures may comprise copper, a copper alloy, silver, gold, tungsten, tantalum, aluminum, and the like. In an embodiment, the steps for forming the interconnect structures may include blanket forming the one or more barrier/adhesion layers, depositing a thin seed layer of a conductive material, and filling the trenches and the vias in the ILD/IMDs with the conductive material, for example, by plating. A chemical-mechanical polishing (CMP) is then performed to remove excess portions of the interconnect structures. In some embodiments, the interconnect structures may provide electrical connections between the various passive and active devices formed on the substrate.

In some embodiments, the processed wafer 101 may be a logic wafer, a memory wafer, a sensor wafer, an analog wafer, or the like. The processed wafer 101 may be formed using a complementary metal-oxide-semiconductor (CMOS) process, a micro-electro-mechanical systems (MEMS) process, a nano-electro-mechanical systems (NEMS) process, the like, or a combination thereof. As described below in greater detail, the processed wafer 101 will be singulated to form individual dies (such as the semiconductor die 100), which will be subsequently packaged to form a stacked semiconductor device.

Referring further to FIGS. 1A and 1B, the contact pads 103 are formed on the processed wafer 101 over the metallization layers. The contact pads 103 electrically couple the processed wafer 101 to external circuitry as described below in greater detail. The contact pads 103 may comprise a conductive material such as copper, tungsten, aluminum, silver, gold, the like, or a combination thereof, and may be formed by an electro-chemical plating process, an electro-less plating process, ALD, PVD, the like, or a combination thereof. In some embodiments, the contact pads 103 may further comprise a thin seed layer (not shown), wherein the conductive material of the contact pads 103 is deposited over the thin seed layer. The seed layer may comprise copper, titanium, nickel, gold, manganese, the like, or a combination thereof, and may be formed by ALD, PVD, sputtering, the like, or a combination thereof.

In the illustrated embodiment, the conductive material of the contact pads 103, such as aluminum, is deposited over the processed wafer 101 and patterned to form the contact pads 103 as illustrated in FIGS. 1A and 1B. The contact pads 103 may be patterned using photolithography techniques. Generally, photolithography techniques involve depositing a photoresist material, which is subsequently irradiated (exposed) and developed to remove a portion of the photoresist material. The remaining photoresist material protects the underlying material, such as the conductive material of the contact pads 103, from subsequent processing steps, such as etching. A suitable etching process, such as a reactive ion etch (RIE) or other dry etch, an isotropic or anisotropic wet etch, or any other suitable etching or patterning process may be applied to the conductive material of the contact pads 103 to remove the exposed portion of the conductive material and form the contact pads 103. In some embodiments, exposed portions of the conductive material such as aluminum may be etched using a mixture of 80% phosphoric acid, 5% nitric acid, 5% acetic acid, and 10% de-ionized (DI) water. In some embodiments, the contact pads 103 have a width $W_1$ between about 37 μm and about 110 μm, such as about 54 μm.

In some embodiments, the passivation layer 105 is formed over the processed wafer 101 and the contact pads 103. In some embodiments, the passivation layer 105 may comprise dielectric materials such as silicon nitride, silicon carbide, silicon oxide, silicon oxynitride, low-k dielectrics such as carbon doped oxides, extremely low-k dielectrics such as porous carbon doped silicon dioxide, the like, or a combination thereof, and may be formed using CVD, PVD, ALD, the like, or a combination thereof.

Referring to further to FIGS. 1A and 1B, the openings 107 are formed in the passivation layer 105 to expose portions of the contact pads 103. In some embodiments, the passivation layer 105 may be patterned using suitable photolithography and etching methods. In some embodiments, a photoresist material (not shown) is formed over the passivation layer 105. The photoresist material is subsequently irradiated (exposed) and developed to remove a portion of the photoresist material. Subsequently, exposed portions of the passivation layer 105 are removed using, for example, a suitable etching process to form the openings 107. In some embodiments, the passivation layer 105 formed of silicon oxide is etched using, for example, buffered hydrofluoric acid (HF). In other embodiments, the passivation layer 105 formed of silicon nitride is etched using, for example, hot phosphoric acid ($H_3PO_4$). In the illustrated embodiment, top-view shapes of the openings 107 are circles. However, in other embodiments, the top-view shapes of the openings 107 may be polygons such as triangles, rectangles, hexagons, or the like. In some embodiments, the openings 107 have a width $W_2$ between about 33 μm and about 106 μm, such as about 50 μm. In some embodiments, the width $W_1$ of the contact pads 103 is larger than the width $W_2$ of the openings 107.

Figure 2A:
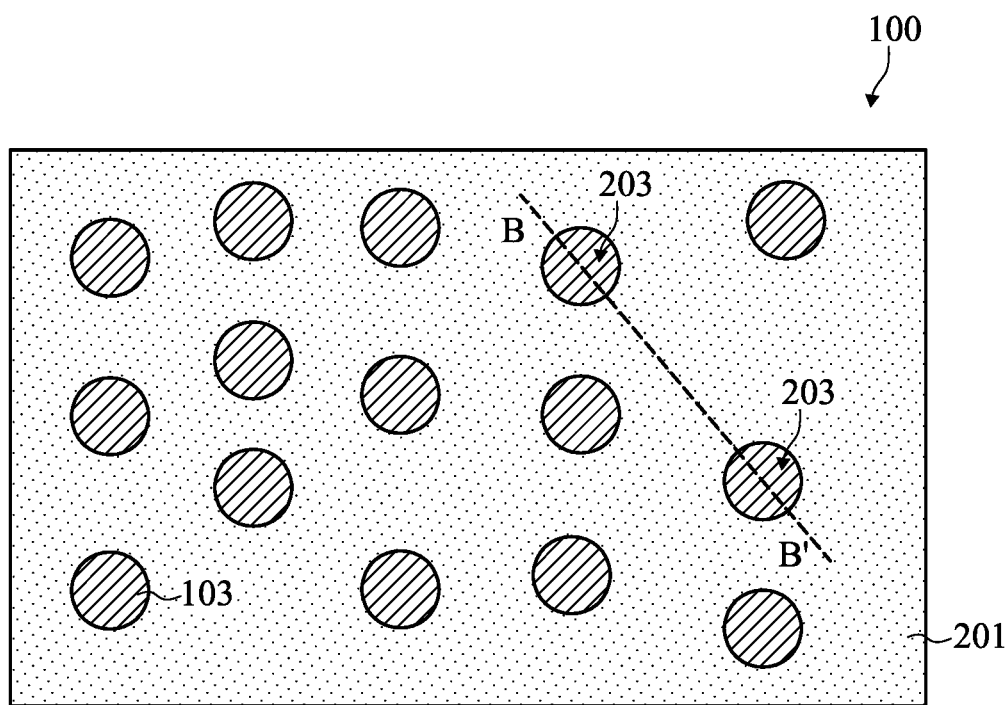
Figure 2B:
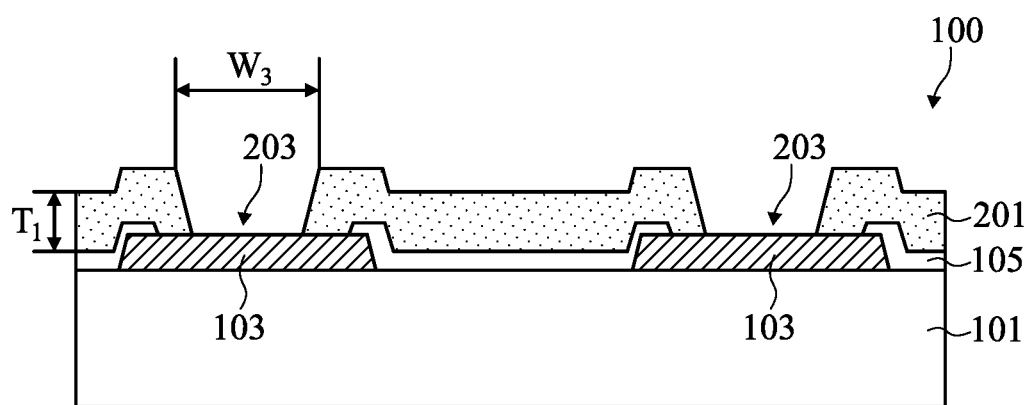

Referring to FIGS. 2A and 2B, a buffer layer 201 is formed over the passivation layer 105 and the contact pads 103. In some embodiments, the buffer layer 201 may comprise dielectric materials such as photo-patternable polymers including, but not limited to, polyimide (PI), benzocyclobutene (BCB), polybenzoxazole (PBO), the like, or a combination thereof. In some embodiments, the buffer layer 201 may be formed using, for example, CVD, a spin-on coating method, or the like. In some embodiments, the buffer layer 201 has a thickness $T_1$ between about 3 μm and about 10 μm.

In some embodiments, the buffer layer 201 is patterned to form openings 203 and expose the contact pads 103. In some embodiments, the openings 203 may be formed using suitable photolithography techniques to expose the buffer layer 201 to light. The buffer layer 201 is developed and/or cured after the exposure. As described below in greater detail, a routing layer is formed in the openings 203 and over the buffer layer 201. In some embodiments, the routing layer comprises first conductive pillars and second conductive pillars (such as first conductive pillars 401 and second conductive pillars 403 illustrated in FIGS. 4A and 4B) formed in the openings 203 and conductive lines (such as conductive lines 405 illustrated in FIGS. 4A and 4B) formed over the buffer layer 201 and interconnecting pairs of the second conductive pillars. In the illustrated embodiment, top-view shapes of the openings 203 are circles. However, in other embodiments, the top-view shapes of the openings 203 may be polygons such as triangles, rectangles, hexagons, or the like. In some embodiments, the openings 203 have a width $W_3$ between about 13 μm and about 86 μm, such as about 30 μm. In some embodiments, the width $W_2$ of the openings 107 is larger than the width $W_3$ of the openings 203.

Figure 3A:
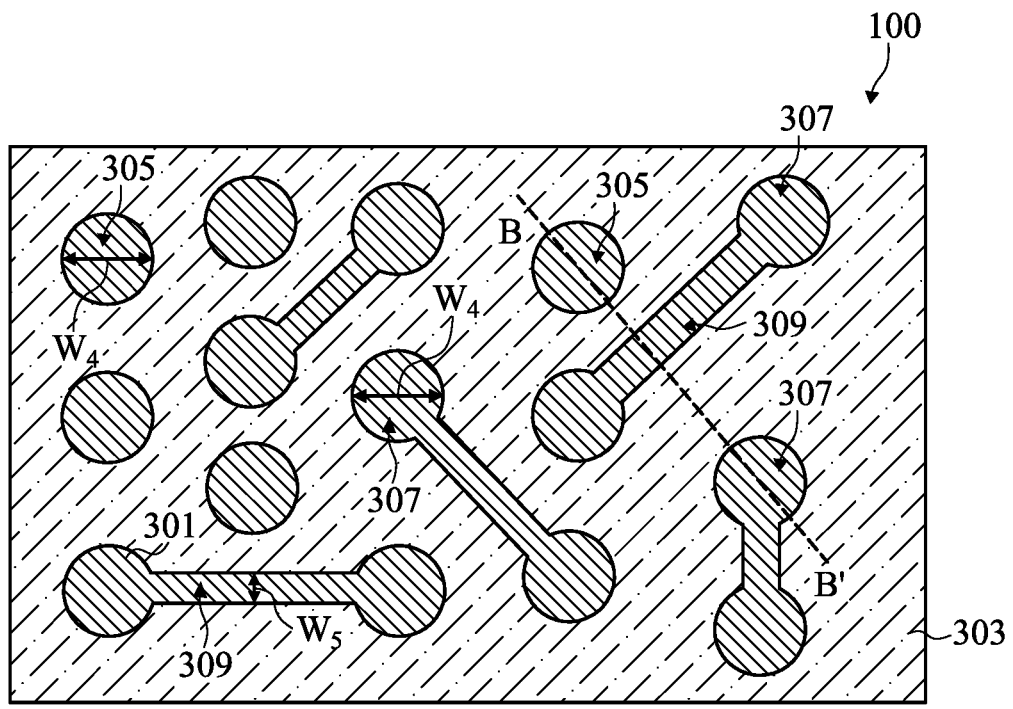
Figure 3B:
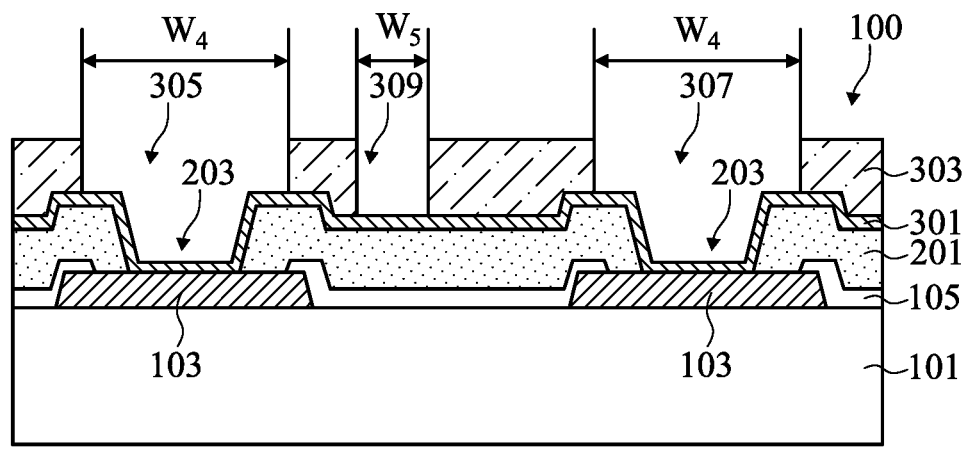

Referring to FIGS. 3A and 3B, a seed layer 301 is blanket deposited over the buffer layer 201 and the openings 203. The seed layer 301 may comprise one or more layers of copper, titanium, nickel, gold, manganese, the like, or a combination thereof, and may be formed by ALD, PVD, sputtering, the like, or a combination thereof. In some embodiments, the seed layer 301 comprises a layer of copper formed over a layer of titanium.

Referring further to FIGS. 3A and 3B, a patterned mask 303 is formed over the seed layer 301. In some embodiments, the patterned mask 303 comprises a photoresist material, or any photo-patternable material. In some embodiments, a material of the patterned mask 303 is deposited, irradiated (exposed) and developed to remove portions of the material and form openings 305, 307 and 309, thereby forming the patterned mask 303. In the illustrated embodiment, the openings 305 and 307 expose portions of the seed layer 301 formed over the contact pads 103 in the openings 203, and the openings 309 expose portions of the seed layer 301 formed over the buffer layer 201. As discussed in greater detail below, first conductive pillars (such as first conductive pillars 401 illustrated in FIGS. 4A and 4B) and second conductive pillars (such as second conductive pillars 403 illustrated in FIGS. 4A and 4B) will be formed in the openings 305 and 307, respectively, to provide electrical connections to the contact pads 103. Furthermore, conductive lines (such as conductive lines 405 illustrated in FIGS. 4A and 4B) will be formed in the openings 309 to electrically interconnect pairs of the second contact pillars. In the illustrated embodiment, top-view shapes of the openings 305 and 307 are circles. However, in other embodiments, the top-view shapes of the openings 305 and 307 may be polygons such as triangles, rectangles, hexagons, or the like. In some embodiments, the openings 305 and 307 have a width $W_4$ between about 33 μm and about 106 μm, such as about 50 μm, and the openings 309 have a width $W_5$ between about 15 μm and about 60 μm, such as about 15 μm.

Figure 4A:
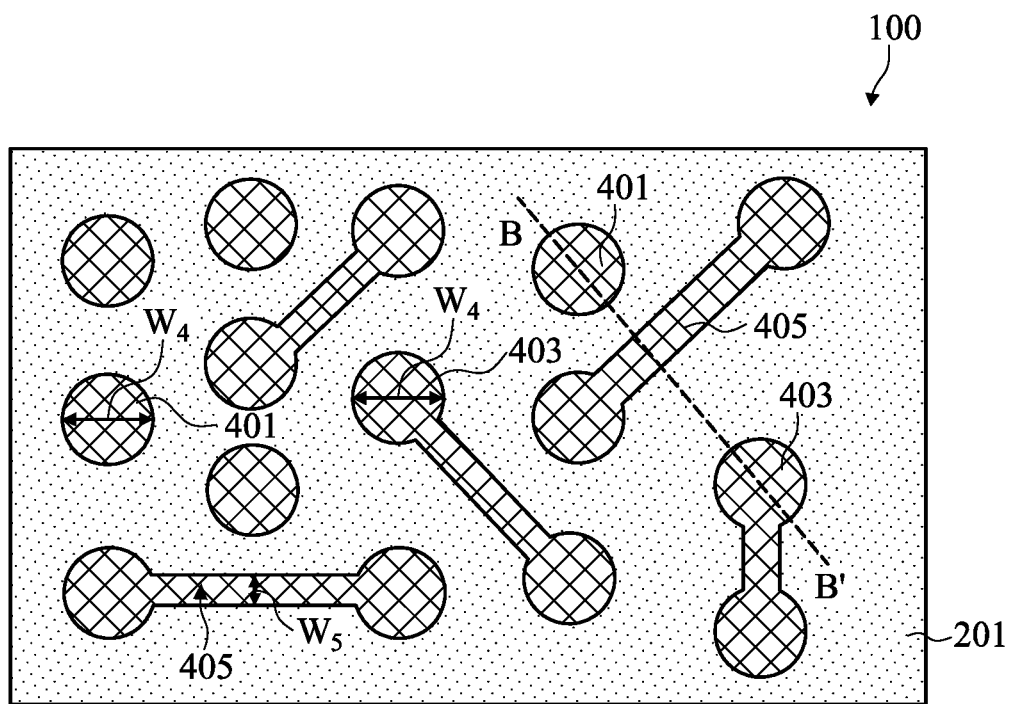
Figure 4B:
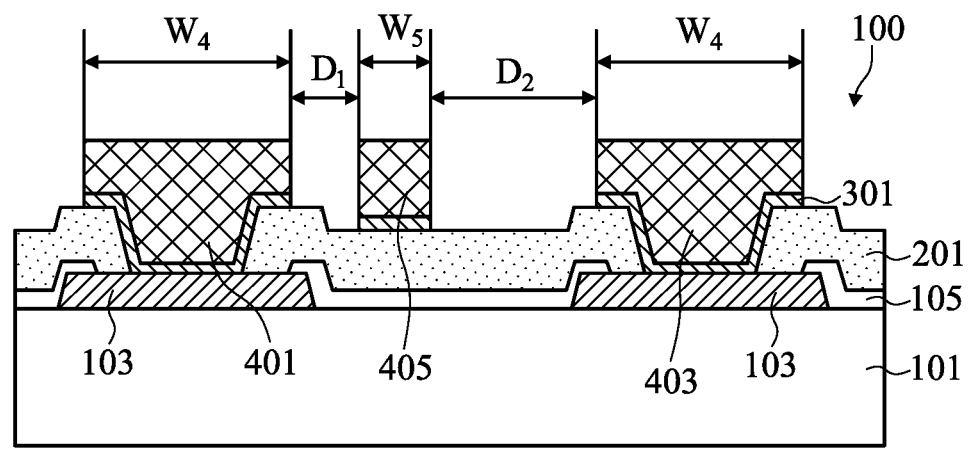

Referring to FIGS. 4A and 4B, first conductive pillars 401 are formed in combined openings formed of the openings 305 and 203 (see FIGS. 3A and 3B), second conductive pillars 403 are formed in combined openings formed of the openings 307 and 203 (see FIGS. 3A and 3B) and conductive lines 405 are formed in the openings 309 (see FIGS. 3A and 3B). In some embodiments, the openings 203, 305, 307 and 309 are filled with a conductive material such as copper, tungsten, aluminum, silver, gold, the like, or a combination thereof, using an electro-chemical plating process, an electroless plating process, ALD, PVD, the like, or a combination thereof. Accordingly, the first conductive pillars 401 and the second conductive pillars 403 have the width $W_4$ of the openings 305 and 307, and the conductive lines 405 have the width $W_5$ of the openings 309. In the illustrated embodiments, the first conductive pillars 401 are not directly coupled to other conductive pillars or the conductive lines 405 and pairs of the second conductive pillars 403 are directly coupled by conductive lines 405. In some embodiments, the conductive line 405 is separated from two neighboring conductive pillars, such as the first conductive pillar 401 and the second conductive pillar 403, by a first distance $D_1$ and a second distance $D_2$, respectively, as illustrated in FIGS. 4A and 4B. In the illustrated embodiment, the second distance $D_2$ is larger than the first distance $D_1$. In other embodiments, the second distance $D_2$ may be less than or equal to the first distance $D_1$. In some embodiments, the first distance $D_1$ is between about 15 μm and about 50 μm, and the second distance $D_2$ is between about 15 μm and about 50 μm.

Referring further to FIGS. 4A and 4B, after forming the first conductive pillars 401, the second conductive pillars 403 and the conductive lines 405, the patterned mask 303 is removed. In some embodiments, the patterned mask 303 comprising a photoresist material is removed using, for example, an ashing process followed by a wet clean process. Subsequently, exposed portions of the seed layer 301 are removed using, for example, a suitable etching process. In an embodiment wherein the seed layer 301 comprises a copper layer formed over a titanium layer, the seed layer 301 may be etched using, for example, a mixture of $FeCl_3$, HCl, and $H_2O$ (for etching copper) and a mixture of $H_2O_2$, HF, and $H_2O$ (for etching titanium).

Figure 5A:
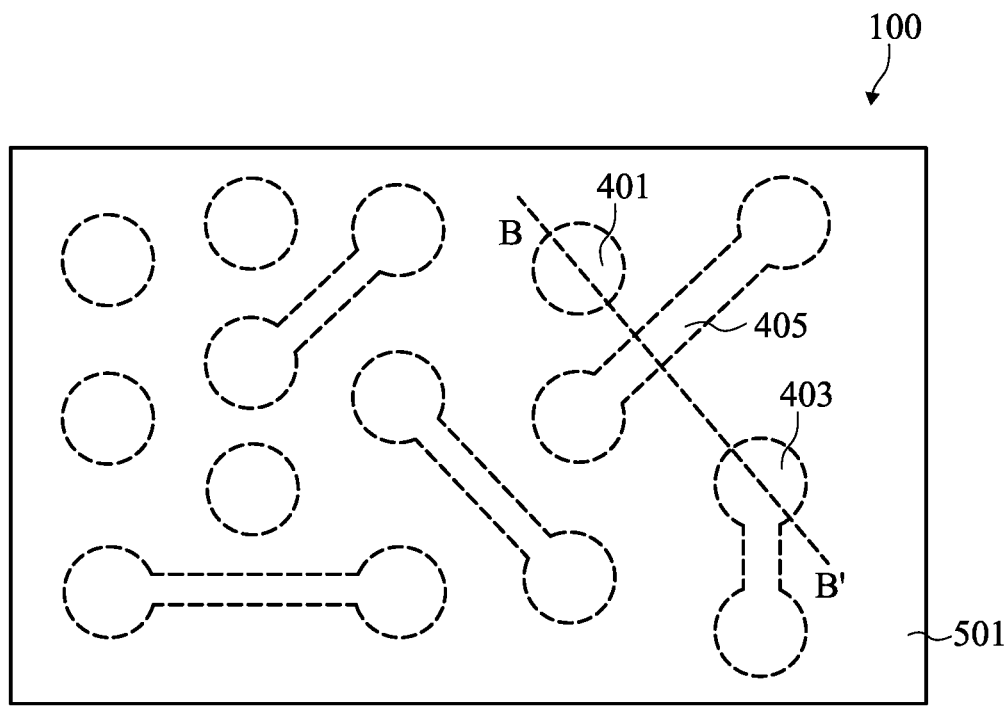
Figure 5B:
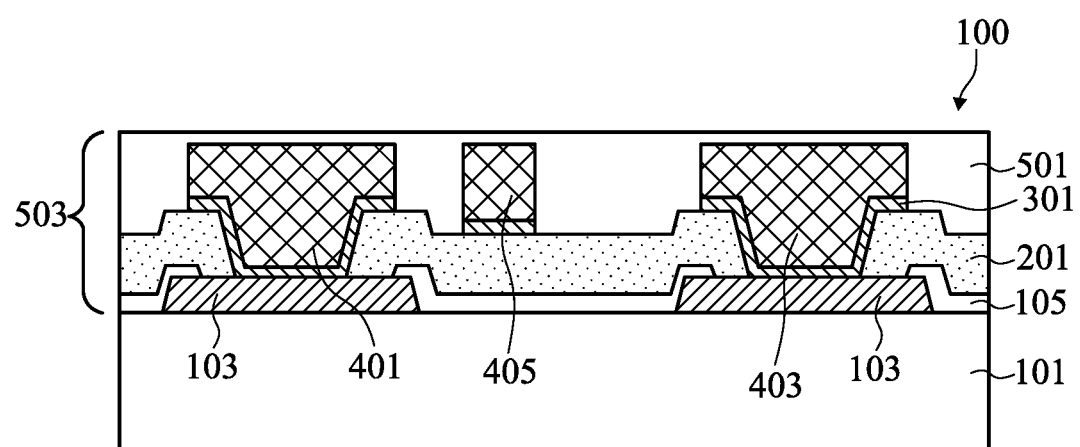

Referring to FIGS. 5A and 5B, a protective layer 501 is formed over and surrounding the first conductive pillars 401, the second conductive pillars 403 and the conductive lines 405. In some embodiments, the protective layer 501 may comprise dielectric materials such as polyimide (PI), benzocyclobutene (BCB), polybenzoxazole (PBO), the like, or a combination thereof, and may be formed using a spin-on coating method, or the like. During the following description, the passivation layer 105, the buffer layer 201, the protective layer 501, the seed layer 301, the first conductive pillars 401, the second conductive pillars 403 and the conductive lines 405 may be collectively referred to as a routing structure 503. In some embodiments, the processed wafer 101 may be singulated into individual semiconductor dies (such as the semiconductor die 100) by sawing, a laser ablation method, or the like. Subsequently, each of the dies may be tested to identify known good dies (KGDs) for further processing.

As described above, the buffer layer 201 is interposed between the passivation layer 105 and the first conductive pillars 401, the second conductive pillars 403 and the conductive lines 405. The use of buffer layer 201 may advantageously allow reducing or eliminating formation of cracks in the passivation layer 105 and layers below, which may be caused, for example, by mismatch of coefficients of thermal expansion (CTE) between the passivation layer 105 and the first conductive pillars 401, the second conductive pillars 403 and the conductive lines 405.

Referring further to FIGS. 5A and 5B, in some embodiments, the contact pads 103 that are contacting the second conductive pillars 403 may be electrically decoupled from the various active and passive devices of the semiconductor die 100 and may be also referred to as floating contact pads. Accordingly, in such embodiments, the second conductive pillars 403 and the conductive lines 405 are not directly coupled to the various active and passive devices of the semiconductor die 100. As described below in greater detail, in some embodiments, one or more redistribution layers (RDLs) may be formed over the routing structure 503 after dicing the processed wafer 101 into individual semiconductor dies (such as the semiconductor die 100). In some embodiments, the RDLs may electrically couple the second conductive pillars 403, the corresponding contact pads 103 and the conductive lines 405 to the various active and passive devices of the semiconductor die 100, for example, by interconnecting the contact pads 103 that are coupled to the various active and passive devices of the semiconductor die 100 to the second conductive pillars 403. In other embodiments, the RDLs may not couple the second conductive pillars 403, the corresponding contact pads 103 and the conductive lines 405 to the various active and passive devices of the semiconductor die 100. In such embodiments, the second conductive pillars 403 and the conductive lines 405 may act as redistribution lines for one or more external devices coupled to the semiconductor die 100. For example, a signal from a first external device may travel through the RDLs to a first pillar of a pair of the second conductive pillars 403, then through a corresponding conductive line 405 to a second pillar of the pair of the second conductive pillars 403, then again thorough RDLs to reach a second external device or another RDL of the first external device, bypassing in the process the various active and passive devices of the semiconductor die 100. By forming the routing structure 503 on the semiconductor die 100 before forming one or more RDLs, it is possible to advantageously simplify a structure of the RDLs. In some embodiments, the number of one or more RDLs may be reduced, which in turn may reduce parasitic contributions from eliminated layers of the one or more RDLs.

FIGS. 6A-10B are top and cross-sectional views of various processing steps during fabrication of a semiconductor die 600 in accordance with some embodiments, wherein an "A" figure represents a top view and a "B" figure represents a cross-sectional view along the B-B' line of the respective "A" figure. As described above with reference to FIGS. 1A-5B, the buffer layer 201 completely covers the passivation layer 105. In embodiments described below, a buffer layer 701 partially covers a passivation layer 605 (see, for example, FIGS. 7A and 7B).

Figure 6A:
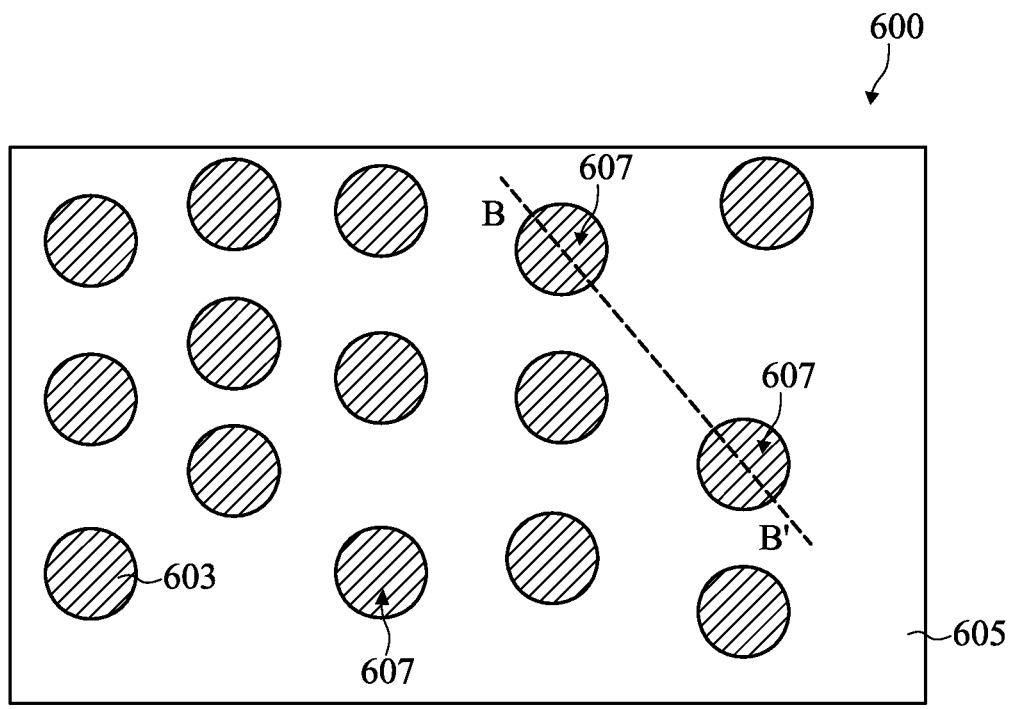
FIGS. 6A, 6B, 7A, 7B, 8A, 8B, 9A, 9B, 10A and 10B are top and cross-sectional views of various processing steps during fabrication of a semiconductor die in accordance with some embodiments.
Figure 6B:
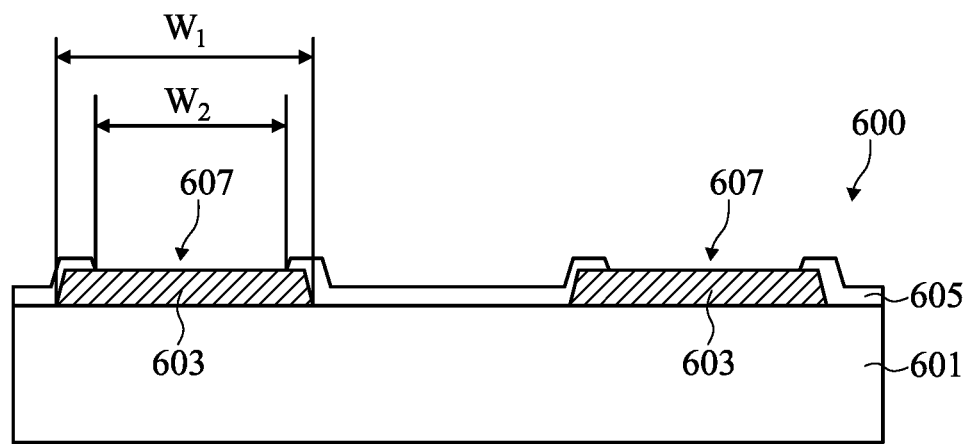

Turning first to FIGS. 6A and 6B, the semiconductor die 600 is illustrated. In the illustrated embodiment, the semiconductor die 600 comprises a portion of a processed wafer 601 having contact pads 603 formed thereon, and a passivation layer 605 formed over the processed wafer 601 and the contact pads 603. The passivation layer 605 is patterned to form openings 607 in the passivation layer 605 and expose portions of the contact pads 603. In some embodiments, the processed wafer 601, the contact pads 603 and the passivation layer 605 may be formed using similar materials and methods as the processed wafer 101, the contact pads 103 and passivation layer 105, respectively, discussed above with reference to FIGS. 1A and 1B and the description is not repeated herein. In some embodiments, the openings 607 in the passivation layer 605 may be formed using similar methods as the openings 107 in the passivation layer 105 discussed above with reference to FIGS. 1A and 1B and the description is not repeated herein. In some embodiments, the contact pads 603 have the width $W_1$ between about 37 µm and about 110 µm, such as about 54 µm. In some embodiments, the openings 607 have the width $W_2$ between about 33 µm and about 106 µm, such as about 50 µm. In some embodiments, the width $W_1$ of the contact pads 603 is larger than the width $W_2$ of the openings 607.

Figure 7A:
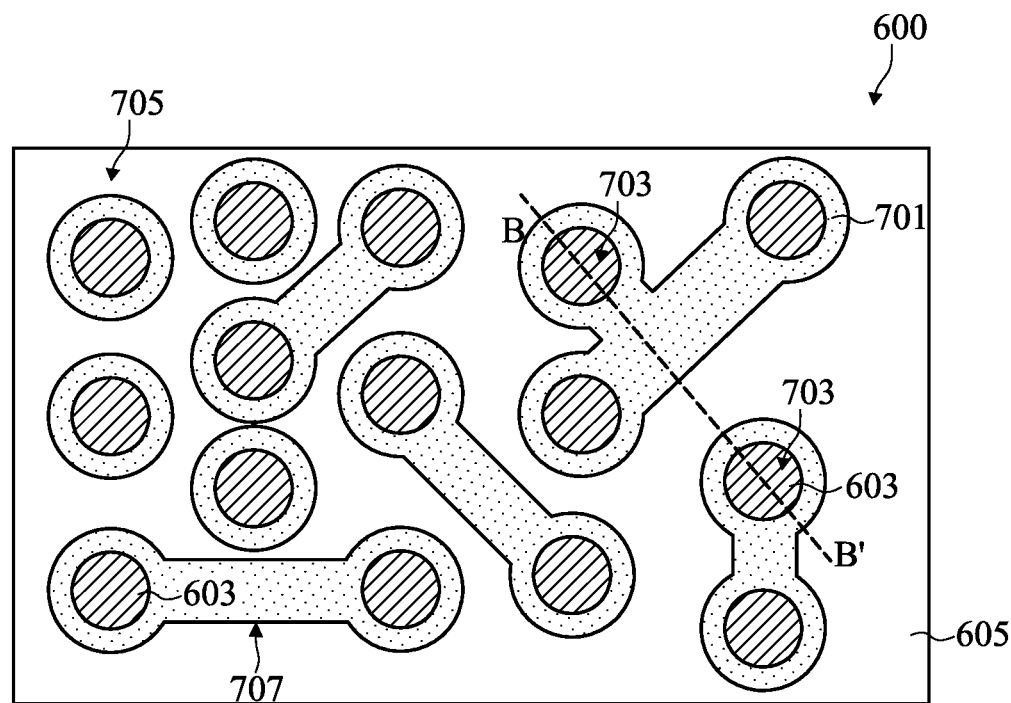
Figure 7B:
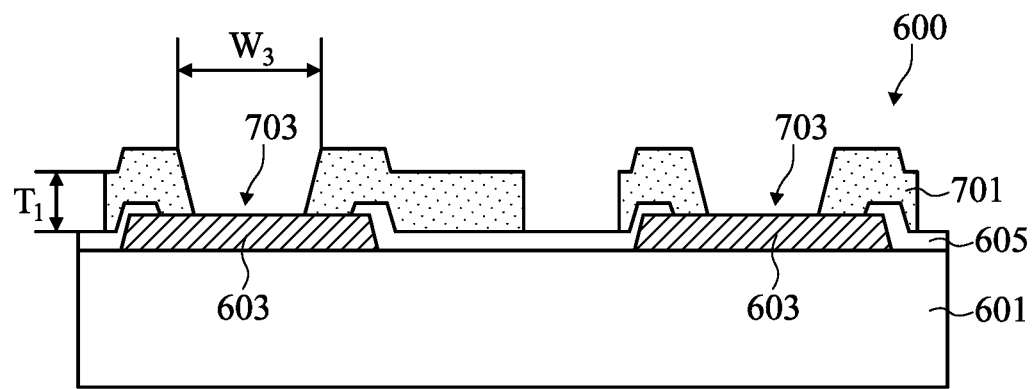

Referring to FIGS. 7A and 7B, a buffer layer 701 is formed over the passivation layer 605 and the contact pads 603. In some embodiments, the buffer layer 701 may be formed and patterned using similar materials and methods as the buffer layer 201 (see, for example, FIGS. 2A and 2B) and the description is not repeated herein. In some embodiments, a thickness of the buffer layer 701 is equal to the thickness $T_1$ between about 3 µm and about 10 µm.

In some embodiments, the buffer layer 701 is patterned to form openings 703 and expose the contact pads 603. Furthermore, the patterning process of the buffer layer 701 exposes portions of the passivation layer 605, such that a desired pattern of the buffer layer 701 is formed over the passivation layer 605 and the contact pads 603. In the illustrated embodiment, top-view shapes of the openings 703 are circles. However, in other embodiments, the top-view shapes of the openings 703 may be polygons such as triangles, rectangles, hexagons, or the like. In some embodiments, the openings 703 have the width $W_3$ between about 13 µm and about 86 µm, such as about 30 µm. In some embodiments, the width $W_2$ of the openings 607 is larger than the width $W_3$ of the openings 703.

A described below in greater detail, a routing layer is formed in the openings 703 and over the buffer layer 701. In some embodiments, the routing layer comprises first conductive pillars and the second conductive pillars (such as first conductive pillars 901 and second conductive pillars 903 illustrated in FIGS. 9A and 9B) formed in the openings 703 and conductive lines (such as conductive lines 905 illustrated in FIGS. 9A and 9B) formed over the buffer layer 701 and interconnecting pairs of the second conductive pillars. In the illustrated embodiment, a pattern of the buffer layer 701 as viewed from the top comprises ring-shaped structures 705 enclosing the openings 703, and rectangular structures 707 interconnecting some pairs of the ring-shaped structures 705. In some embodiments, as viewed from the top, the first contact pillars and the second contact pillars may have circular shapes similar to the ring-shaped structures 705 and the conductive lines may have rectangular shapes similar to the rectangular structures 707 (see, for example, FIG. 9A).

Figure 8A:
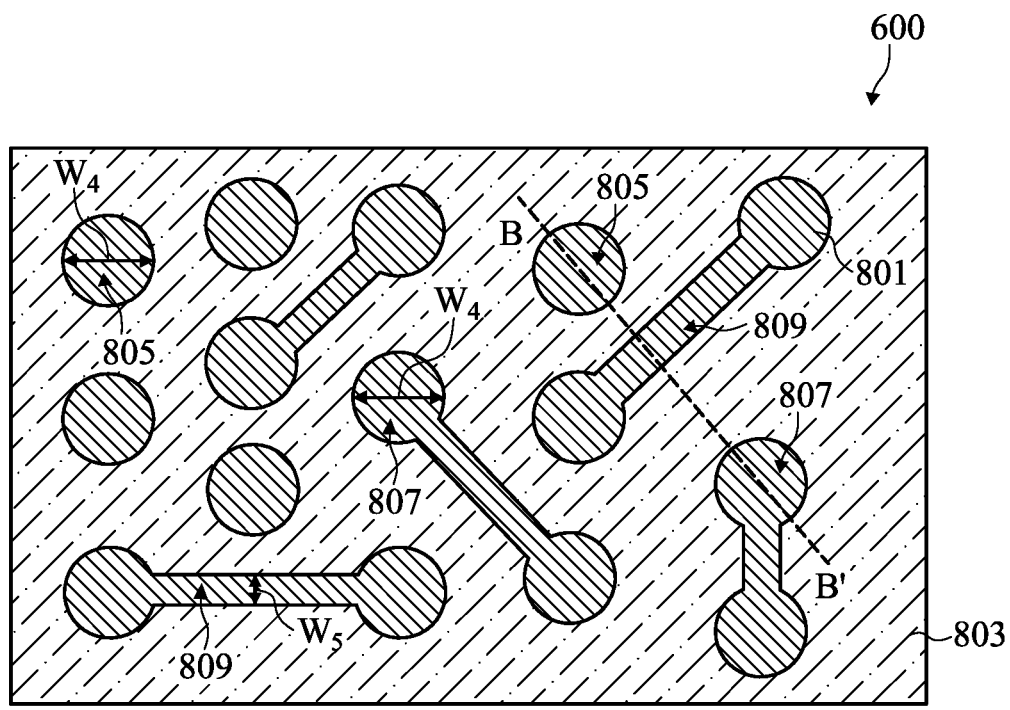
Figure 8B:
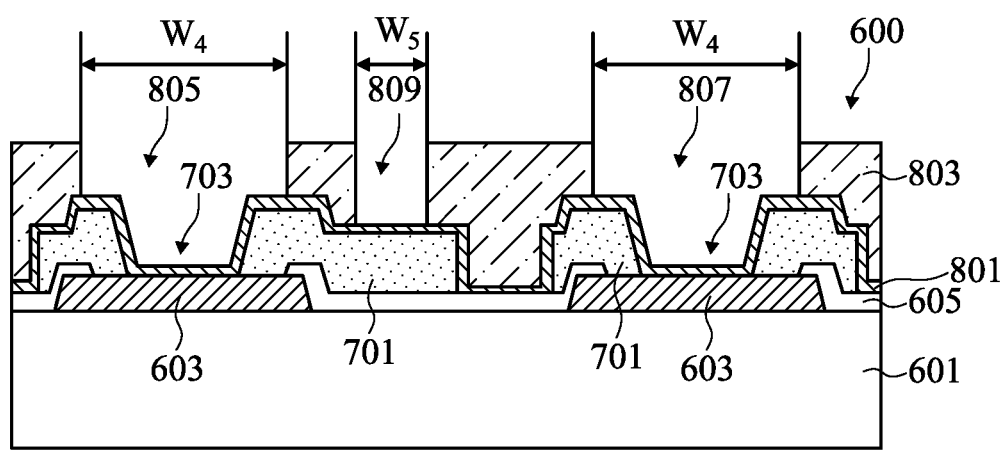

Referring to FIGS. 8A and 8B, a seed layer 801 is blanket deposited over the buffer layer 701, the passivation layer 605 and in the openings 703. In some embodiments, the seed layer 801 may be formed using similar materials and methods as the seed layer 301 (see, for example, FIGS. 3A and 3B) and the description is not repeated herein.

Referring further to FIGS. 8A and 8B, a patterned mask 803 is formed over the seed layer 801. In some embodiments, the patterned mask 803 may be formed using similar materials and methods as the patterned mask 303 (see, for example, FIGS. 3A and 3B) and the description is not repeated herein. In some embodiments, the patterned mask 803 has openings 805, 807 and 809 formed therein. In the illustrated embodiment, the openings 805 and 807 expose portions of the seed layer 801 formed over the contact pads 603 in the openings 703, and the openings 809 expose portions of the seed layer 801 formed over the buffer layer 701. As discussed in greater detail below, first conductive pillars (such as the first conductive pillars 901 illustrated in FIGS. 9A and 9B) and second conductive pillars (such as the second conductive pillars 903 illustrated in FIGS. 9A and 9B) will be formed in the openings 805 and 807, respectively, to provide electrical connections to the contact pads 603. Furthermore, conductive lines (such as the conductive lines 905 illustrated in FIGS. 9A and 9B) will be formed in the openings 809 to electrically interconnect pairs of the second contact pillars. In the illustrated embodiment, top-view shapes of the openings 805 and 807 are circles. However, in other embodiments, the top-view shapes of the openings 805 and 807 may be polygons such as triangles, rectangles, hexagons, or the like. In some embodiments, the openings 805 and 807 have a width $W_4$ between about 33 μm and about 106 μm, such as about 50 μm, and the openings 809 have a width $W_5$ between about 15 μm and about 60 μm, such as about 15 μm.

Figure 9A:
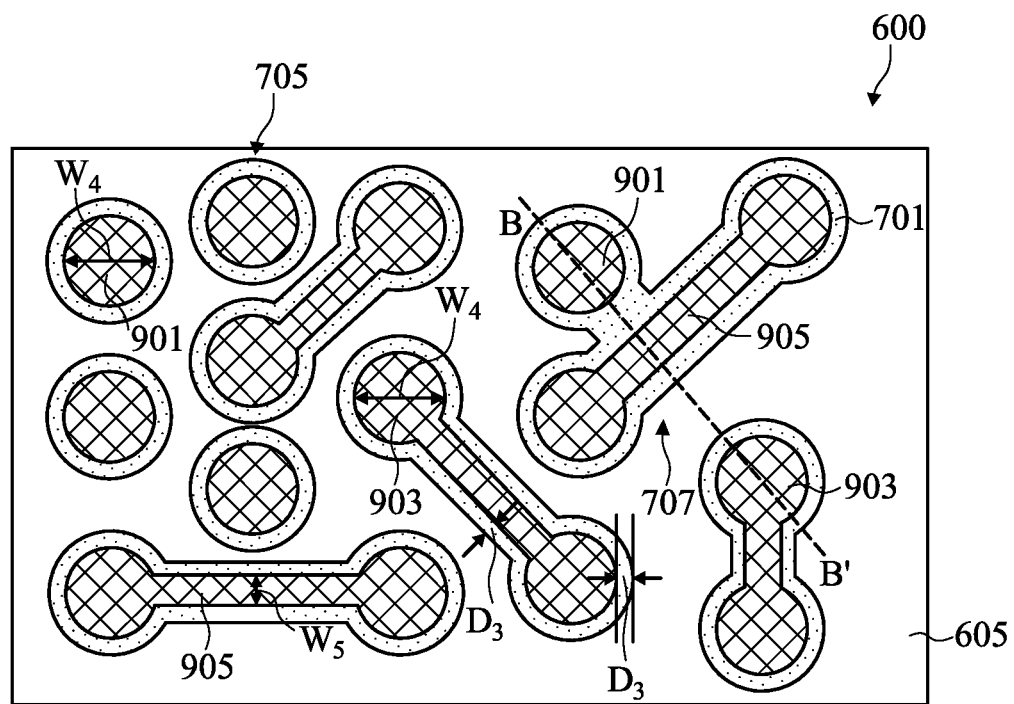
Figure 9B:
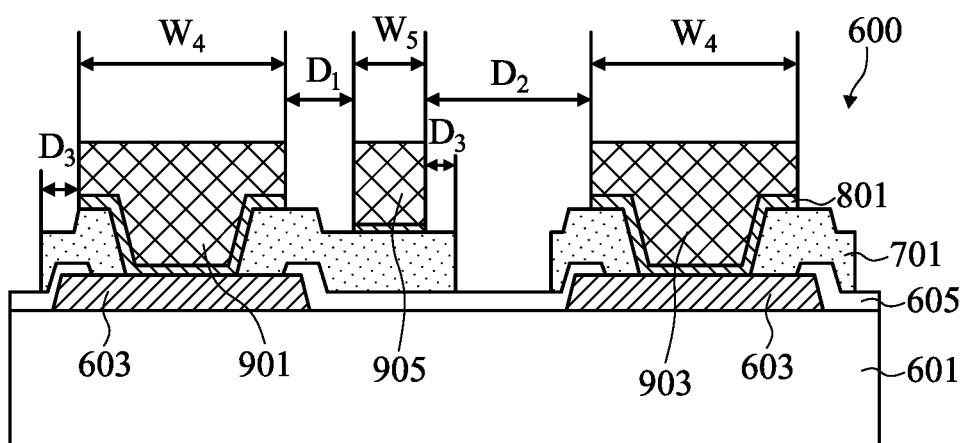

Referring to FIGS. 9A and 9B, the first conductive pillars 901 are formed in combined openings formed by the openings 805 and 703, the second conductive pillars 903 are formed in combined openings formed by the openings 807 and 703, and the conductive lines 905 are formed in the openings 809 (see FIGS. 8A and 8B). In some embodiments, the first conductive pillars 901, the second conductive pillars 903 and the conductive lines 905 may be formed using similar materials and methods as the first conductive pillars 401, the second conductive pillars 403 and the conductive lines 405 (see, for example, FIGS. 4A and 4B) and the description is not repeated herein. Accordingly, the first conductive pillars 901 and the second conductive pillars 903 have the width $W_4$ of the openings 805 and 807, and the conductive lines 905 have the width $W_5$ of the openings 809. In some embodiments, the conductive line 905 is separated from two neighboring conductive pillars, such as the first conductive pillar 901 and the second conductive pillar 903, by the first distance $D_1$ and the second distance $D_2$, respectively, as illustrated in FIGS. 9A and 9B. In the illustrated embodiment, the second distance $D_2$ is larger than the first distance $D_1$. In other embodiments, the second distance $D_2$ may be less than or equal to the first distance $D_1$. In some embodiments, the first distance $D_1$ is between about 15 μm and about 50 μm, and the second distance $D_2$ is between about 15 μm and about 50 μm.

Referring further to FIGS. 9A and 9B, after forming the first conductive pillars 901, the second conductive pillars 903 and the conductive lines 905, the patterned mask 803 is removed. In some embodiments, the patterned mask 803 comprising a photoresist material is removed using, for example, an ashing process followed by a wet clean process. Subsequently, exposed portions of the seed layer 801 are removed using similar methods as the seed layer 301 (see, for example, FIGS. 4A and 4B) and the description is not repeated herein.

FIG. 9A illustrates that a top-view pattern of the routing layer, comprising the first conductive pillars 901, the second conductive pillars 903 and the conductive lines 905, is similar to a top-view pattern of the buffer layer 701, with elements of the top-view pattern of the buffer layer 701 having larger sizes than similar elements of the top-view pattern of the routing layer. In some embodiments, the buffer layer 701 and the patterned mask 803 may be patterned using masks having features of same sizes. However, due to process variations, a same feature of a mask after being transferred to the buffer layer 701 and the patterned mask 803 may have different sizes depending on material properties of the buffer layer 701 and the patterned mask 803, and patterning methods used. In the illustrated embodiment, an outer diameter of the ring-shaped structures 705 is larger than the width $W_4$ of the first conductive pillars 901 and the second conductive pillars 903, and a width of the rectangular structures 707 is larger than the width $W_5$ of the conductive lines 905. In some embodiments, sidewalls of the first conductive pillars 901 and the second conductive pillars 903 are separated from corresponding outer sidewalls of the ring-shaped structures 705 by a third distance $D_3$ between about 3 μm and about 7 μm, such as about 5 μm, and sidewalls of the conductive lines 905 are separated from corresponding sidewalls of the rectangular structures 707 by the third distance $D_3$. However, in other embodiments, the third distance $D_3$ may vary depending on properties of patterned materials and patterning methods used. Accordingly, the outer diameter of the ring-shaped structures 705 is equal to $W_4+2D_3$, and the width of the rectangular structures 707 is equal to $W_5+2D_3$.

Referring further to FIGS. 9A and 9B, due to process variations, some of the features that are resolved in the patterned mask 803 may not be resolved in the buffer layer 701. In some embodiments, if features to be patterned in the buffer layer 701 are less than a critical dimension, such features will not be resolved by the patterning process. In some embodiments, the critical dimension is about 10 μm for the buffer layer 701, and the critical dimension is about 8 μm for the patterned mask 803. However, in other embodiments, the critical dimensions may vary depending on properties of patterned materials and patterning methods used. In the illustrated embodiment, the first distance $D_1$ is less than the critical dimension for the buffer layer 701 and the second distance $D_2$ is greater than the critical dimension for the buffer layer 701. Accordingly, ring-shaped structure 705 and the rectangular structure 707 corresponding to the first conductive pillar 901 and the conductive line 905 that are separated by the first distance $D_1$ are not resolved and form a single continuous structure. Furthermore, ring-shaped structure 705 and the rectangular structure 707 corresponding to the second conductive pillar 903 and the conductive line 905 that are separated by the second distance $D_2$ are resolved and form two disconnected structures. Moreover, since the critical dimension for the patterned mask 803 is less than the critical dimension for the buffer layer 701, the openings 805, 807, 809 and the corresponding first conductive pillars 901, second conductive pillars 903 and conductive lines 905 are fully resolved as illustrated in FIGS. 9A and 8B.

Figure 10A:
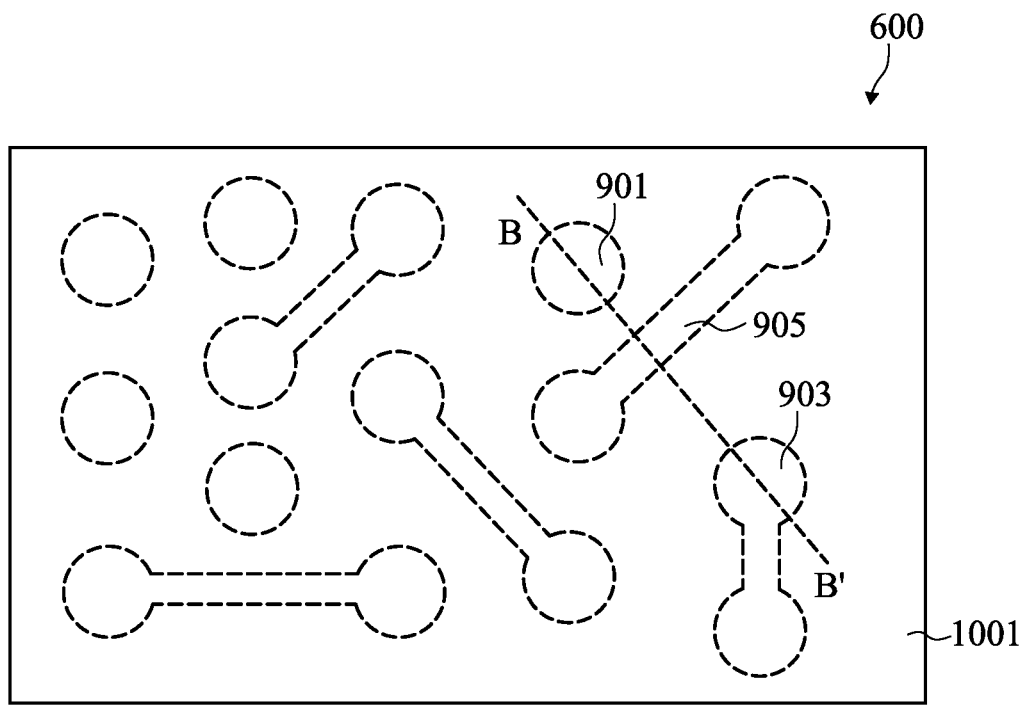
Figure 10B:
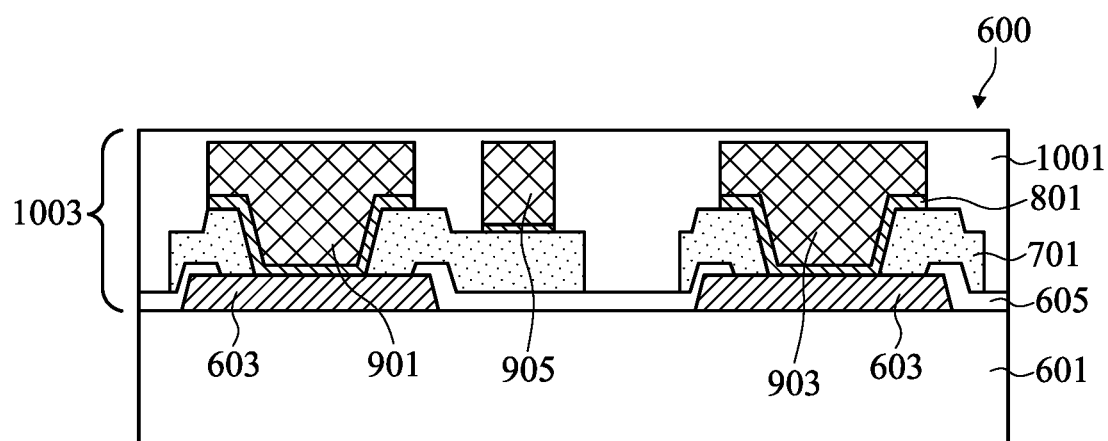

Referring to FIGS. 10A and 10B, a protective layer 1001 is formed over and surrounding the first conductive pillars 901, the second conductive pillars 903 and the conductive lines 905. In some embodiments, the protective layer 1001 may be formed using similar materials and methods as the protective layer 501 (see, for example, FIGS. 5A and 5B) and the description is not repeated herein. During the following description, the passivation layer 605, the buffer layer 701, the protective layer 1001, the seed layer 801, the first conductive pillars 901, the second conductive pillars 903 and the conductive lines 905 may be collectively referred to as a routing structure 1003. In some embodiments, the processed wafer 601 may be singulated into individual semiconductor dies (such as the semiconductor die 600) by sawing, a laser ablation method, or the like. Subsequently, each of the dies may be tested to identify known good dies (KGDs) for further processing.

As described above, the buffer layer 701 is interposed between the passivation layer 605 and the first conductive pillars 901, the second conductive pillars 903 and the conductive lines 905. The use of buffer layer 701 may advantageously allow reducing or eliminating formation of cracks in the passivation layer 605 and layers below, which may be caused, for example, by mismatch of coefficients of thermal expansion (CTE) between the passivation layer 605 and the first conductive pillars 901, the second conductive pillars 903 and the conductive lines 905.

Referring further to FIGS. 10A and 10B, in some embodiments, the contact pads 603 that are contacting the second conductive pillars 903 may be electrically decoupled from the various active and passive devices of the semiconductor die 600 and may be also referred to as floating contact pads. Accordingly, in such embodiments, the second conductive pillars 903 and the conductive lines 905 are not directly coupled to the various active and passive devices of the semiconductor die 600. As described below in greater detail, in some embodiments, one or more redistribution layers (RDLs) may be formed over the routing structure 1003 after dicing the processed wafer 601 into individual semiconductor dies (such as the semiconductor die 600). In some embodiments, the RDLs may electrically couple the second conductive pillars 903, the corresponding contact pads 603 and the conductive lines 905 to the various active and passive devices of the semiconductor die 600, for example, by interconnecting the contact pads 603 that are coupled to the various active and passive devices of the semiconductor die 600 to the second conductive pillars 903. In other embodiments, the RDLs may not couple the second conductive pillars 903, the corresponding contact pads 603 and the conductive lines 905 to the various active and passive devices of the semiconductor die 600. In such embodiments, the second conductive pillars 903 and the conductive lines 905 may act as redistribution lines for one or more external devices coupled to the semiconductor die 600. For example, a signal from a first external device may travel through the RDLs to a first pillar of a pair of the second conductive pillars 903, then through a corresponding conductive line 905 to a second pillar of the pair of the second conductive pillars 903, then again thorough RDLs to reach a second external device or another RDL of the first external device, bypassing in the process the various active and passive devices of the semiconductor die 600. By forming the routing structure 1003 on the semiconductor die 600 before forming one or more RDLs, it is possible to advantageously simplify a structure of the RDLs. In some embodiments, the number of one or more RDLs may be reduced, which in turn may reduce parasitic contributions from eliminated layers of the one or more RDLs.

FIGS. 11A-15B are top and cross-sectional views of various processing steps during fabrication of a semiconductor die 1100 in accordance with some embodiments, wherein an "A" figure represents a top view and a "B" figure represents a cross-sectional view along the B-B' line of the respective "A" figure. In the embodiment described below, a pattern of a buffer layer 1201 (see, for example, FIGS. 12A and 12B) is different from a pattern of the buffer layer 701 (see, for example, FIGS. 7A and 7B). In particular, the pattern of the buffer layer 1201 may be obtained from the pattern of the buffer layer 701 by removing the ring-shaped structures 705 corresponding to the first conductive pillars 901 from the pattern of the buffer layer 701. Since cracks tend to form predominantly below the conductive lines 905, by removing the ring-shaped structures 705 corresponding to the first conductive pillars 901 from the buffer layer 701, desired characteristics of the semiconductor die 1100 are not adversely affected.

Figure 11A:
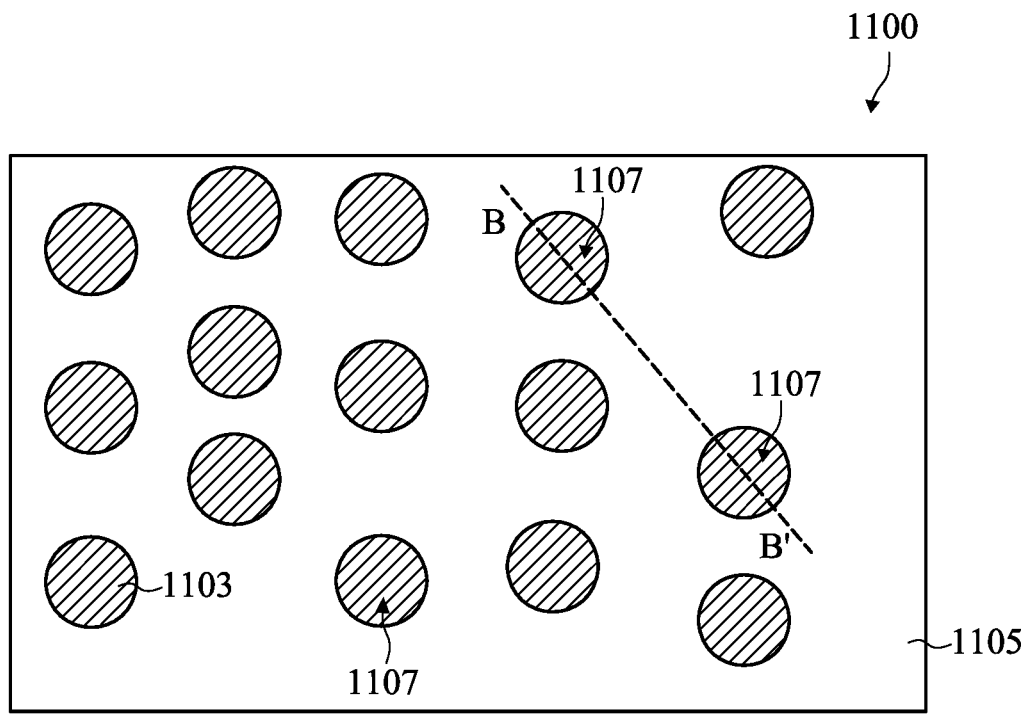
FIGS. 11A, 11B, 12A, 12B, 13A, 13B, 14A, 14B, 15A and 15B are top and cross-sectional views of various processing steps during fabrication of a semiconductor die in accordance with some embodiments.
Figure 11B:
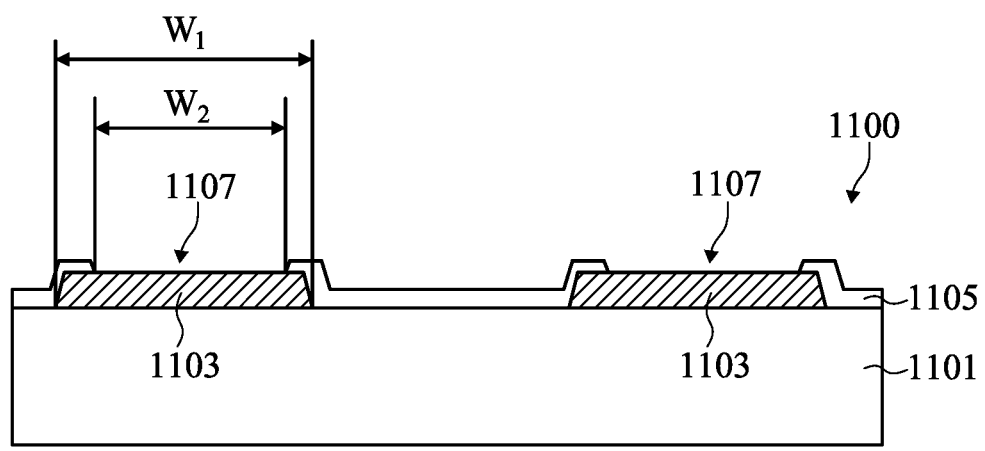

Turning first to FIGS. 11A and 11B, the semiconductor die 1100 is illustrated. In the illustrated embodiment, the semiconductor die 1100 comprises a portion of a processed wafer 1101 having contact pads 1103 formed thereon, and a passivation layer 1105 formed over the processed wafer 1101 and the contact pads 1103. The passivation layer 1105 is patterned to form openings 1107 in the passivation layer 1105 and expose portions of the contact pads 1103. In some embodiments, the processed wafer 1101, the contact pads 1103 and the passivation layer 1105 may be formed using similar materials and methods as the processed wafer 101, the contact pads 103 and passivation layer 105, respectively, discussed above with reference to FIGS. 1A and 1B and the description is not repeated herein. In some embodiments, the openings 1107 in the passivation layer 1105 may be formed using similar methods as the openings 107 in the passivation layer 105 discussed above with reference to FIGS. 1A and 1B and the description is not repeated herein. In some embodiments, the contact pads 1103 have the width $W_1$ between about 37 μm and about 110 μm, such as about 54 μm. In some embodiments, the openings 1107 have the width $W_2$ between about 33 μm and about 106 μm, such as about 50 μm. In some embodiments, the width $W_1$ of the contact pads 1103 is larger than the width $W_2$ of the openings 1107.

Figure 12A:
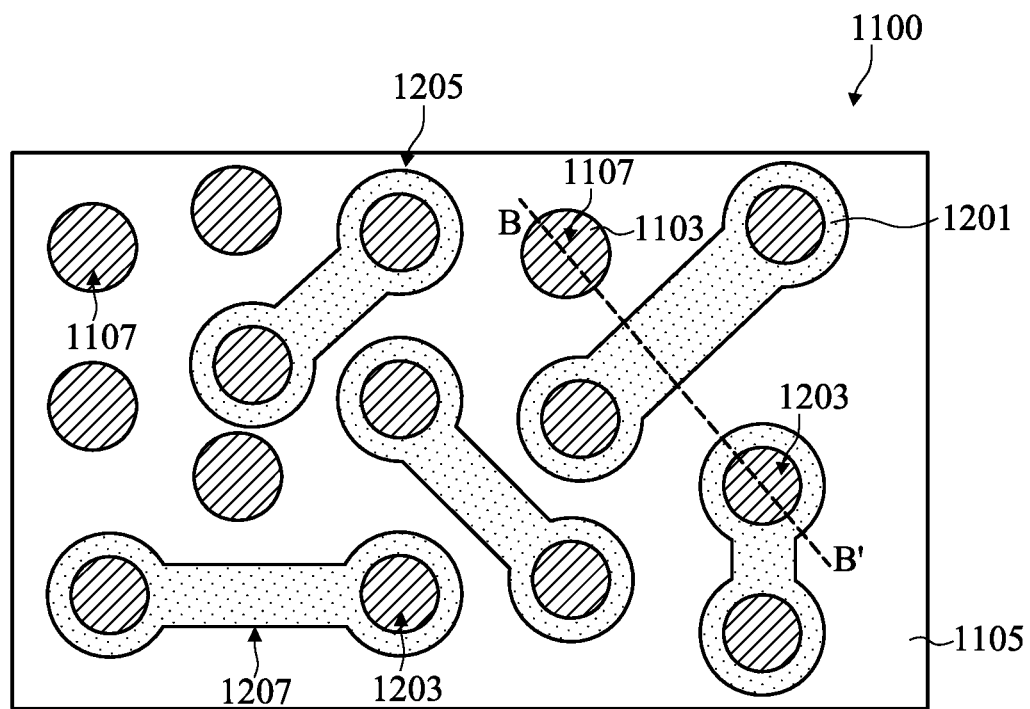
Figure 12B:
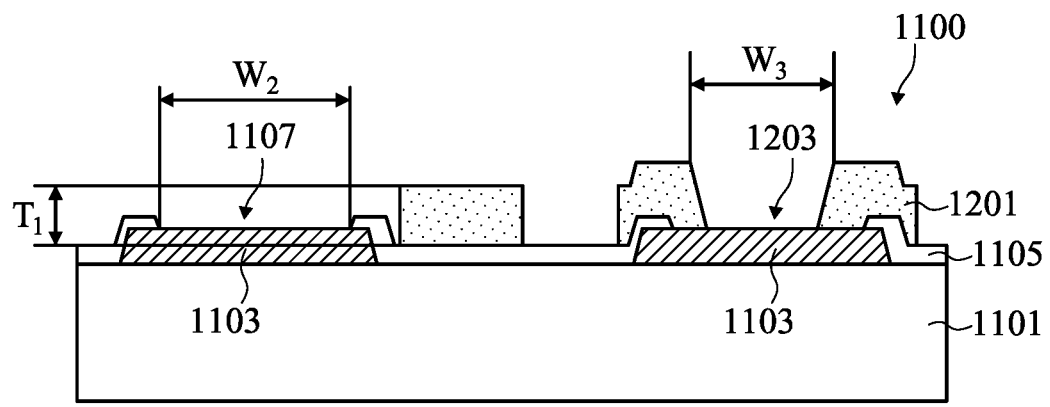

Referring to FIGS. 12A and 12B, a buffer layer 1201 is formed over the passivation layer 1105 and the contact pads 1103. In some embodiments, the buffer layer 1201 may be formed and patterned using similar materials and methods as the buffer layer 201 (see, for example, FIGS. 2A and 2B) and the description is not repeated herein. In some embodiments, a thickness of the buffer layer 1201 is equal to the thickness $T_1$ between about 3 μm and about 10 μm.

In some embodiments, the buffer layer 1201 is patterned form a desired pattern. In the illustrated embodiments, the buffer layer 1201 is patterned to form openings 1203, which partially expose some of the openings 1107 and the contact pads 1103. In some embodiments, the patterning process of the buffer layer 1201 fully exposes some of the openings 1107. In the illustrated embodiment, top-view shapes of the openings 1203 are circles. However, in other embodiments, the top-view shapes of the openings 1203 may be polygons such as triangles, rectangles, hexagons, or the like. In some embodiments, the openings 1203 have the width $W_3$ between about 13 μm and about 86 μm, such as about 30 μm.

In some embodiments, the width $W_2$ of the openings 1107 is larger than the width $W_3$ of the openings 1203.

As described below in greater detail, a routing layer is formed in the openings 1107 and 1203 and over the buffer layer 1201. In some embodiments, the routing layer comprises first conductive pillars (such as first conductive pillars 1401 illustrated in FIGS. 14A and 14B) formed in the openings 1107, second conductive pillars (such as second conductive pillars 1403 illustrated in FIGS. 14A and 14B) formed in the openings 1203 and conductive lines (such as conductive lines 1405 illustrated in FIGS. 14A and 14B) formed over the buffer layer 1201 and interconnecting pairs of the second conductive pillars. In the illustrated embodiment, a pattern of the buffer layer 1201 as viewed from the top comprises ring-shaped structures 1205 enclosing the openings 1203, and rectangular structures 1207 interconnecting pairs of the ring-shaped structures 1205. In some embodiments, as viewed from the top, the first contact pillars and the second contact pillars may have circular shapes similar to the ring-shaped structures 1205 and the conductive lines may have rectangular shapes similar to the rectangular structures 1207 (see, for example, FIG. 14A).

Figure 13A:
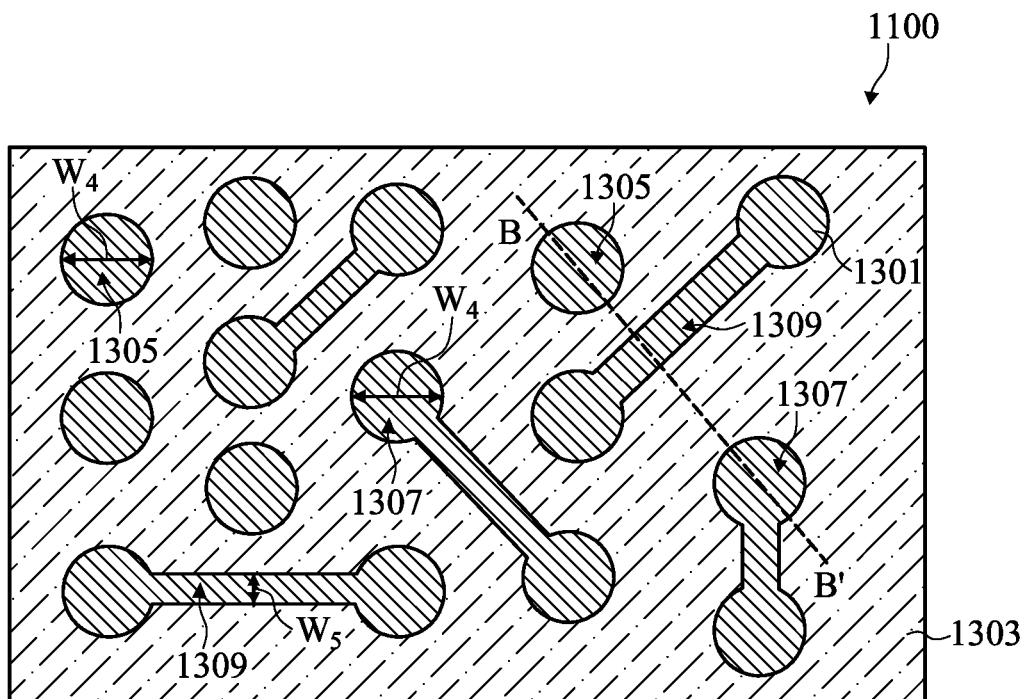
Figure 13B:
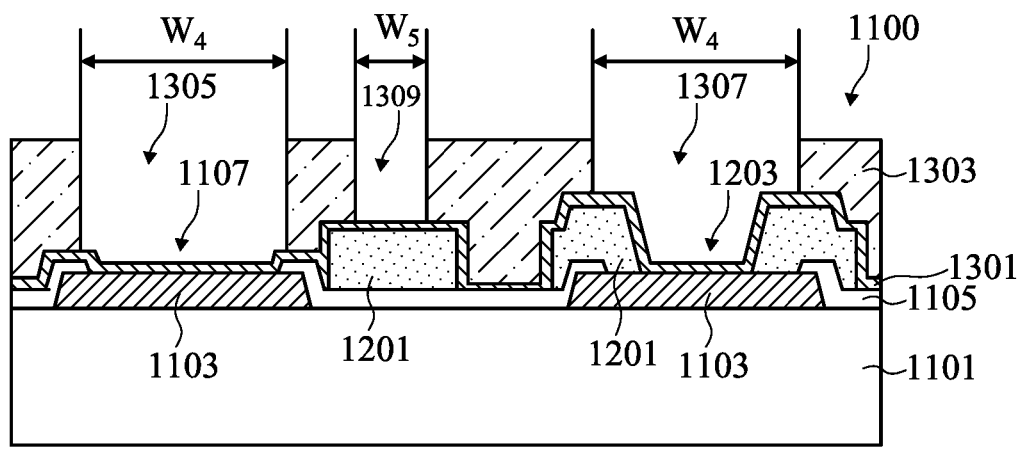

Referring to FIGS. 13A and 13B, a seed layer 1301 is blanket deposited over the buffer layer 1201, the passivation layer 1105 and the openings 1107 and 1203. In some embodiments, the seed layer 1301 may be formed using similar materials and methods as the seed layer 301 (see, for example, FIGS. 3A and 3B) and the description is not repeated herein.

Referring further to FIGS. 13A and 13B, a patterned mask 1303 is formed over the seed layer 1301. In some embodiments, the patterned mask 1303 may be formed using similar materials and methods as the patterned mask 303 (see, for example, FIGS. 3A and 3B) and the description is not repeated herein. In some embodiments, the patterned mask 1303 has openings 1305, 1307 and 1309 formed therein. In the illustrated embodiment, the openings 1305 and 1307 expose portions of the seed layer 1301 formed over the contact pads 1103 in the openings 1107 and 1203, respectively, and the openings 1309 expose portions of the seed layer 1301 formed over the buffer layer 1201. As discussed in greater detail below, the first conductive pillars (such as the first conductive pillars 1401 illustrated in FIGS. 14A and 14B) and the second conductive pillars (such as the second conductive pillars 1403 illustrated in FIGS. 14A and 14B) will be formed in the openings 1305 and 1307, respectively, to provide electrical connections to the contact pads 1103. Furthermore, the conductive lines (such as the conductive lines 1405 illustrated in FIGS. 14A and 14B) will be formed in the openings 1309 to electrically interconnect pairs of the second contact pillars. In the illustrated embodiment, top-view shapes of the openings 1305 and 1307 are circles. However, in other embodiments, the top-view shapes of the openings 1305 and 1307 may be polygons such as triangles, rectangles, hexagons, or the like. In some embodiments, the openings 1305 and 1307 have a width $W_4$ between about 33 µm and about 106 µm, such as about 50 µm, and the openings 1309 have a width $W_5$ between about 15 µm and about 60 µm, such as about 15 µm.

Figure 14A:
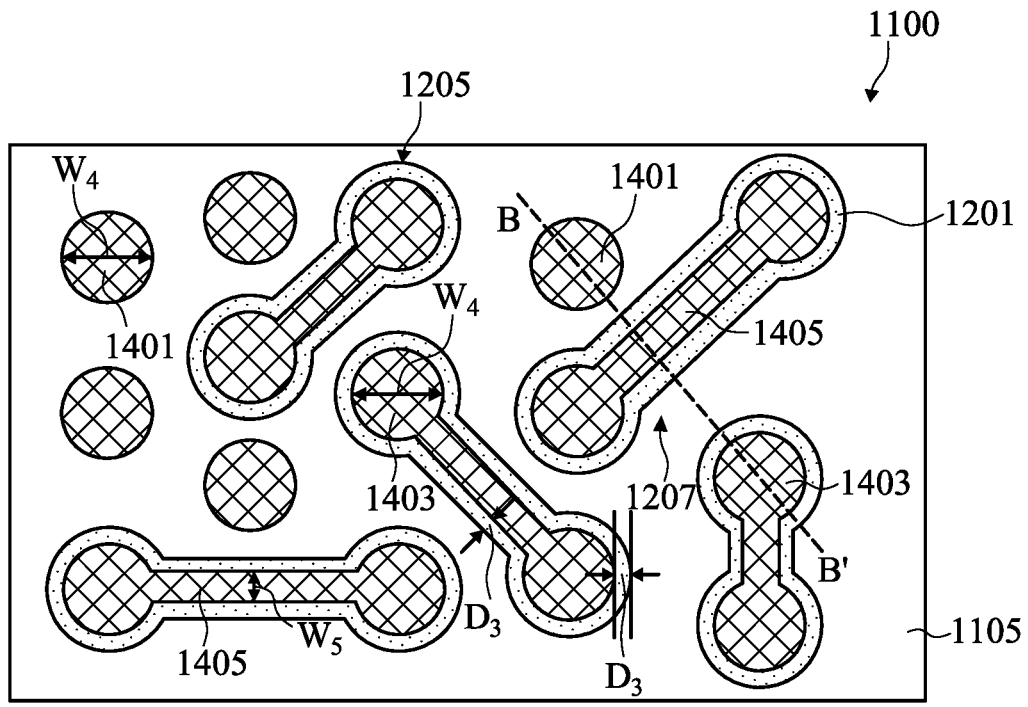
Figure 14B:
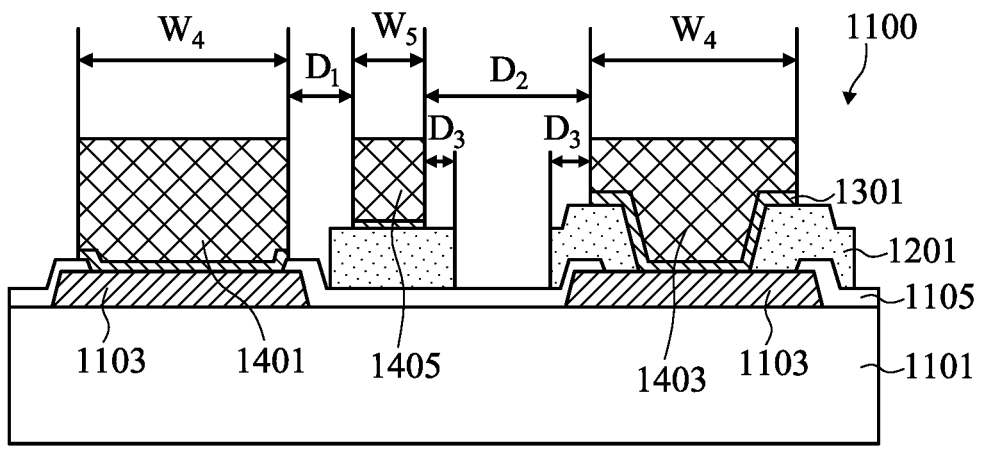

Referring to FIGS. 14A and 14B, the first conductive pillars 1401 are formed in combined openings formed by the openings 1305 and 1107, the second conductive pillars 1403 are formed in combined openings formed by the openings 1307 and 1203, and the conductive lines 1405 are formed in the openings 1309 (see FIGS. 13A and 13B). In some embodiments, the first conductive pillars 1401, the second conductive pillars 1403 and the conductive lines 1405 may be formed using similar materials and methods as the first conductive pillars 401, the second conductive pillars 403 and the conductive lines 405 (see, for example, FIGS. 4A and 4B) and the description is not repeated herein. Accordingly, the first conductive pillars 1401 and the second conductive pillars 1403 have the width $W_4$ of the openings 1305 and 1307, and the conductive lines 1405 have the width $W_5$ of the openings 1309. In some embodiments, the conductive line 1405 is separated from two neighboring conductive pillars, such as the first conductive pillar 1401 and the second conductive pillar 1403, by the first distance $D_1$ and the second distance $D_2$, respectively, as illustrated in FIGS. 14A and 14B. In the illustrated embodiment, the second distance $D_2$ is larger than the first distance $D_1$. In other embodiments, the second distance $D_2$ may be less than or equal to the first distance $D_1$. In some embodiments, the first distance $D_1$ is between about 15 µm and about 50 µm, and the second distance $D_2$ is between about 15 µm and about 50 µm.

Referring further to FIGS. 14A and 14B, after forming the first conductive pillars 1401, the second conductive pillars 1403 and the conductive lines 1405, the patterned mask 1303 is removed. In some embodiments, the patterned mask 1303 comprising a photoresist material is removed using, for example, an ashing process followed by a wet clean process. Subsequently, exposed portions of the seed layer 1301 are removed using similar methods as the seed layer 301 (see, for example, FIGS. 4A and 4B) and the description is not repeated herein.

FIG. 14A illustrates that a top-view pattern of the routing layer, comprising the first conductive pillars 1401, the second conductive pillars 1403 and the conductive lines 1405. In some embodiments, a top-view pattern of the second conductive pillars 1403 and the conductive lines 1405 is similar to a top-view pattern of the buffer layer 1201, with elements of the top-view pattern of the buffer layer 1201 having larger sizes than similar elements of the top-view pattern of the second conductive pillars 1403 and the conductive lines 1405. In some embodiments, the buffer layer 1201 and the patterned mask 1303 may be patterned using masks having features of same sizes. However, due to process variations, a same feature of a mask after being transferred to the buffer layer 1201 and the patterned mask 1303 may have different sizes depending on material properties of the buffer layer 1201 and the patterned mask 1303, and patterning methods used. In the illustrated embodiment, an outer diameter of the ring-shaped structures 1205 is larger than the width $W_4$ of the second conductive pillars 1403, and a width of the rectangular structures 1207 is larger than the width $W_5$ of the conductive lines 1405. In some embodiments, sidewalls of the second conductive pillars 1403 are separated from corresponding outer sidewalls of the ring-shaped structures 1205 by the third distance $D_3$, and sidewalls of the conductive lines 1405 are separated from corresponding sidewalls of the rectangular structures 1207 by the third distance $D_3$. In some embodiments, the third distance $D_3$ may vary depending on properties of patterned materials and patterning methods used. Accordingly, the outer diameter of the ring-shaped structures 1205 is equal to $W_4+2D_3$, and the width of the rectangular structures 1207 is equal to $W_5+2D_3$.

Figure 15A:
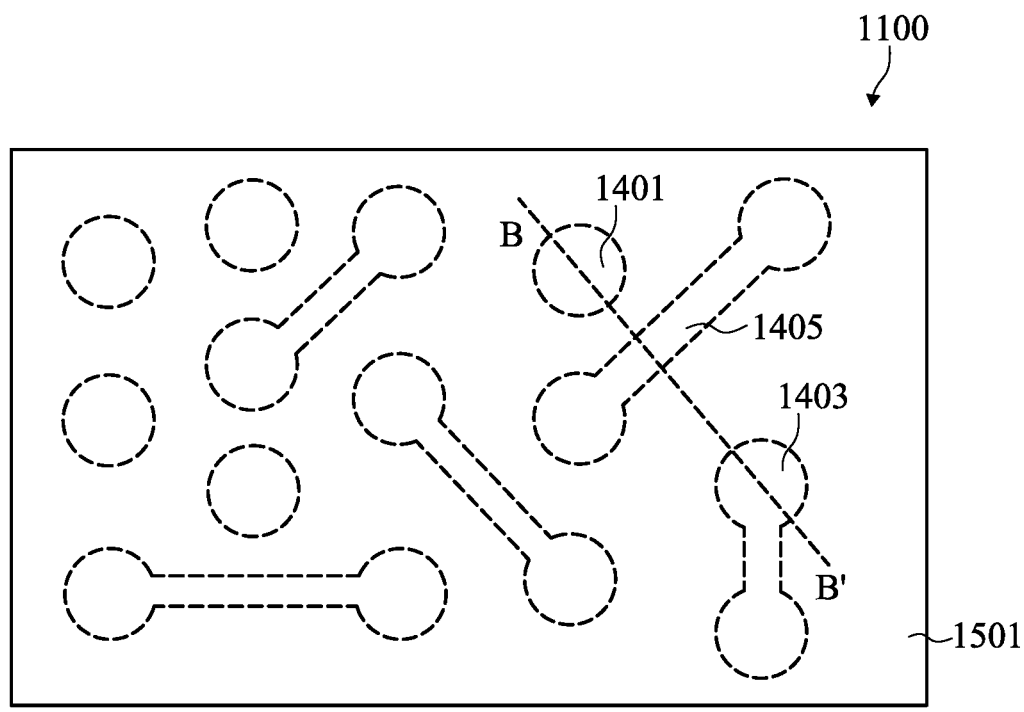
Figure 15B:
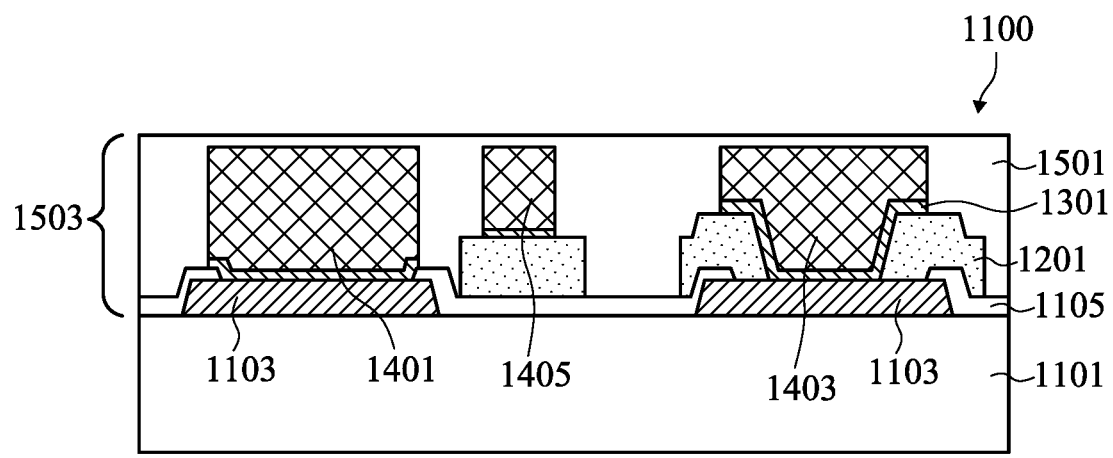

Referring to FIGS. 15A and 15B, a protective layer 1501 is formed over the first conductive pillars 1401, the second conductive pillars 1403 and the conductive lines 1405. In some embodiments, the protective layer 1501 may be formed using similar materials and methods as the protective layer 501 (see, for example, FIGS. 5A and 5B) and the description is not repeated herein. During the following description, the passivation layer 1105, the buffer layer 1201, the protective layer 1501, the seed layer 1301, the first conductive pillars 1401 the second conductive pillars 1403 and the conductive lines 1405 may be collectively referred to as a routing structure 1503. In some embodiments, the processed wafer 1101 may be singulated into individual semiconductor dies (such as the semiconductor die 1100) by sawing, a laser ablation method, or the like. Subsequently, each of the dies may be tested to identify known good dies (KGDs) for further processing.

As described above, the buffer layer 1201 is interposed between the passivation layer 1105 and the second conductive pillars 1403 and the conductive lines 1405. The use of buffer layer 1201 may advantageously allow reducing or eliminating formation of cracks in the passivation layer 1105 and layers below, which may be caused, for example, by mismatch of coefficients of thermal expansion (CTE) between the passivation layer 1105 and the second conductive pillars 1403 and the conductive lines 1405.

Referring further to FIGS. 15A and 15B, in some embodiments, the contact pads 1103 that are contacting the second conductive pillars 1403 may be electrically decoupled from the various active and passive devices of the semiconductor die 1100 and may be also referred to as floating contact pads. Accordingly, in such embodiments, the second conductive pillars 1403 and the conductive lines 1405 are not directly coupled to the various active and passive devices of the semiconductor die 1100. As described below in greater detail, in some embodiments, one or more redistribution layers (RDLs) may be formed over the routing structure 1503 after dicing the processed wafer 1101 into individual semiconductor dies (such as the semiconductor die 1100). In some embodiments, the RDLs may electrically couple the second conductive pillars 1403, the corresponding contact pads 1103 and the conductive lines 1405 to the various active and passive devices of the semiconductor die 1100, for example, by interconnecting the contact pads 1103 that are coupled to the various active and passive devices of the semiconductor die 1100 to the second conductive pillars 1403. In other embodiments, the RDLs may not couple the second conductive pillars 1403, the corresponding contact pads 1103 and the conductive lines 1405 to the various active and passive devices of the semiconductor die 1100. In such embodiments, the second conductive pillars 1403 and the conductive lines 1405 may act as redistribution lines for one or more external devices coupled to the semiconductor die 1100. For example, a signal from a first external device may travel through the RDLs to a first pillar of a pair of the second conductive pillars 1403, then through a corresponding conductive line 1405 to a second pillar of the pair of the second conductive pillars 1403, then again thorough RDLs to reach a second external device or another RDL of the first external device, bypassing in the process the various active and passive devices of the semiconductor die 1100. By forming the routing structure 1503 on the semiconductor die 1100 before forming one or more RDLs, it is possible to advantageously simplify a structure of the RDLs. In some embodiments, the number of one or more RDLs may be reduced, which in turn may reduce parasitic contributions from eliminated layers of the one or more RDLs.

Figure 16:
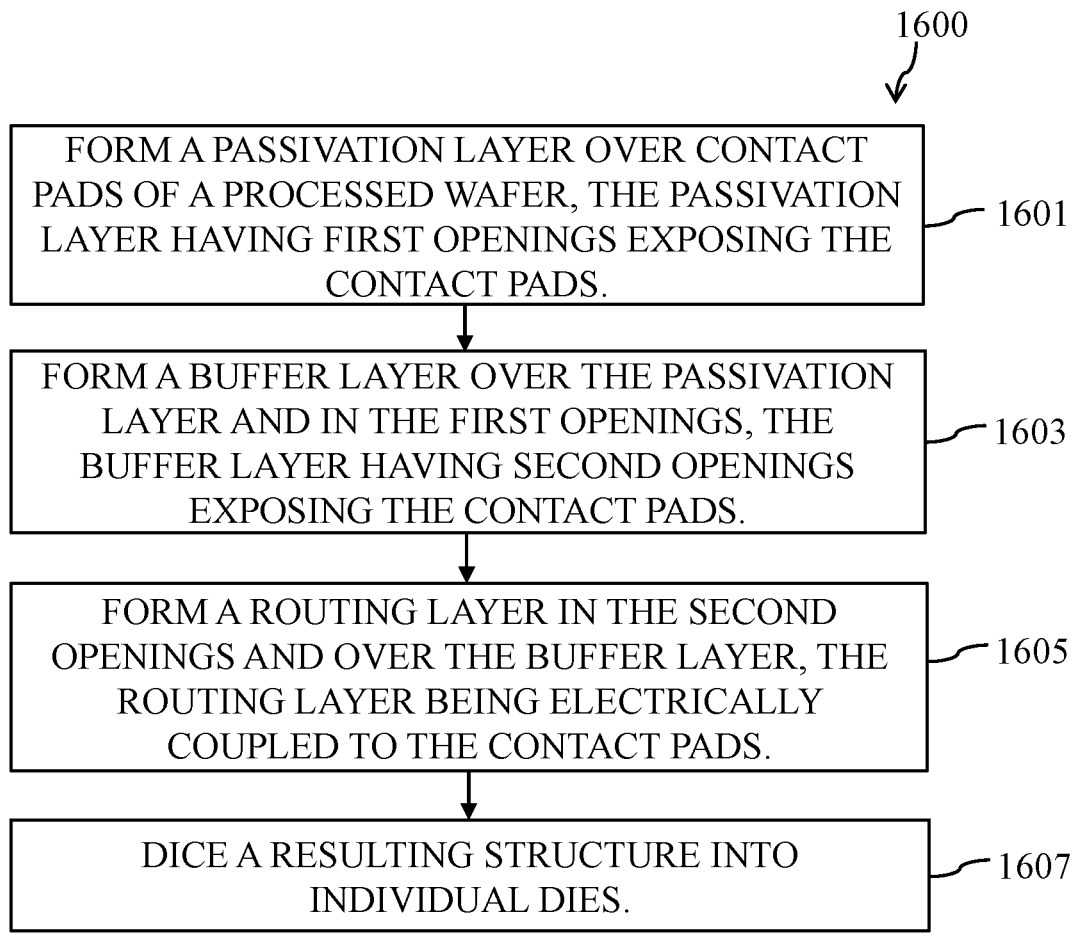
FIG. 16 is a flow diagram illustrating a method of forming a semiconductor die in accordance with some embodiments.

FIG. 16 is a flow diagram illustrating a method 1600 of forming a semiconductor die in accordance with some embodiments. The method 1600 starts at step 1601, wherein a passivation layer (such as the passivation layers 105, 605 or 1105) is formed over contact pads (such as the contact pads 103, 603 or 1103) of a processed wafer (such as the processed wafers 101, 601 or 1101) as described above with reference to FIGS. 1A and 1B, 6A and 6B, or 11A and 11B. In some embodiments, the passivation layer has first openings (such as the openings 107, 607 or 1107) formed therein as described above with reference to FIGS. 1A and 1B, 6A and 6B, or 11A and 11B. In step 1603, a buffer layer (such as the buffer layers 201, 701 or 1201) is formed on the passivation layer and the contact pads as described above with reference to FIGS. 2A and 2B, 7A and 7B, or 12A and 12B. In some embodiments, the buffer layer has second openings (such as the openings 203, 703 or 1203) formed therein as described above with reference to FIGS. 2A and 2B, 7A and 7B, or 12A and 12B. In step 1605, a routing layer is formed in the second openings and over the buffer layer as described above with reference to FIG. 3A-4B, 8A-9B, or 13A-14B. In some embodiments, the routing layer comprises first conductive pillars (such as the first conductive pillars 401, 901 or 1401), second conductive pillars (such as the second conductive pillars 403, 903 or 1403) and conductive lines (such as the conductive lines 405, 905 or 1405) that interconnect pairs of the second conductive pillars as described above with reference to FIGS. 4A and 4B, 9A and 9B, or 14A and 14B. The first conductive pillars and the second conductive pillars contact the conductive pads as described above with reference to FIGS. 4A and 4B, 9A and 9B, or 14A and 14B. In step 1607, a resulting structure is singulated to form individual dies (such as the semiconductor dies 100, 600 or 1100) as described above with reference to FIGS. 5A and 5B, 1A and 10B, or 15A and 15B.

FIGS. 17-21 are cross-sectional views of various processing steps during fabrication of a stacked semiconductor device in accordance with some embodiments. As described below in greater detail, semiconductor dies (such as the semiconductor dies 100, 600 or 1100) will undergo various processing steps to form the stacked semiconductor device 2100 (see, for example, FIG. 21).

Figure 17:
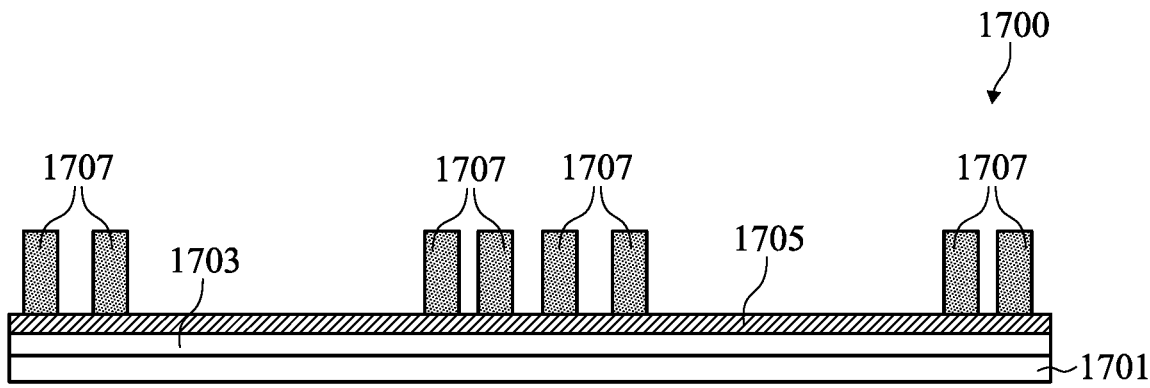
FIGS. 17-21 are cross-sectional views of various processing steps during fabrication of a stacked semiconductor device in accordance with some embodiments.

Referring first to FIG. 17, in some embodiments, a release layer 1703 is formed over a carrier 1701, and one or more dielectric layers 1705 is formed over the release layer 1703 to start forming a packaged semiconductor device 1700. In some embodiments, the carrier 1701 may be formed of quartz, glass, or the like, and provides mechanical support for subsequent operations. In some embodiments, the release layer 1703 may comprise a light to heat conversion (LTHC) material, a UV adhesive, or the like, and may be formed using a spin-on coating process, a printing process, a lamination process, or the like. In some embodiments, the release layer 1703 formed of a LTHC material when exposed to light partially or fully loses its adhesive strength and the carrier 1701 can be easily removed from the back side of the packaged semiconductor device 1700. In some embodiments, the one or more dielectric layers 1705 may be formed using similar materials and methods as the passivation layer 105 (see, for example, FIGS. 1A and 1B) and the description is not repeated herein. In other embodiments, the one or more dielectric layers 1705 may be formed using similar materials and methods as the buffer layer 201 (see, for example, FIGS. 2A and 2B) and the description is not repeated herein.

Referring further to FIG. 17, conductive vias 1707 are formed on the one or more dielectric layers 1705. In some embodiments, a seed layer (not shown) is formed on the one or more dielectric layers 1705. The seed layer seed may comprise copper, titanium, nickel, gold, the like, or a combination thereof, and may be formed using an electrochemical plating process, ALD, PVD, sputtering, the like, or a combination thereof. In some embodiments, a sacrificial layer (not shown) is formed over the seed layer. A plurality of openings is formed in the sacrificial layer to expose the seed layer. In some embodiments wherein the sacrificial layer comprises a photoresist material, the sacrificial layer may be patterned using suitable photolithography methods. In some embodiments, the openings are filled with conductive materials as such copper, aluminum, nickel, gold, silver, palladium, the like, or a combination thereof using an electro-chemical plating process, ALD, the like, or a combination thereof to form the conductive vias 1707. After the formation of the conductive vias 1707, the sacrificial layer is then removed. In some embodiments wherein the sacrificial layer comprises a photoresist material, the sacrificial layer may be removed using an ashing process followed by a wet clean process. Subsequently, exposed portions of the seed layer are removed using, for example, a suitable etching process.

Figure 18:
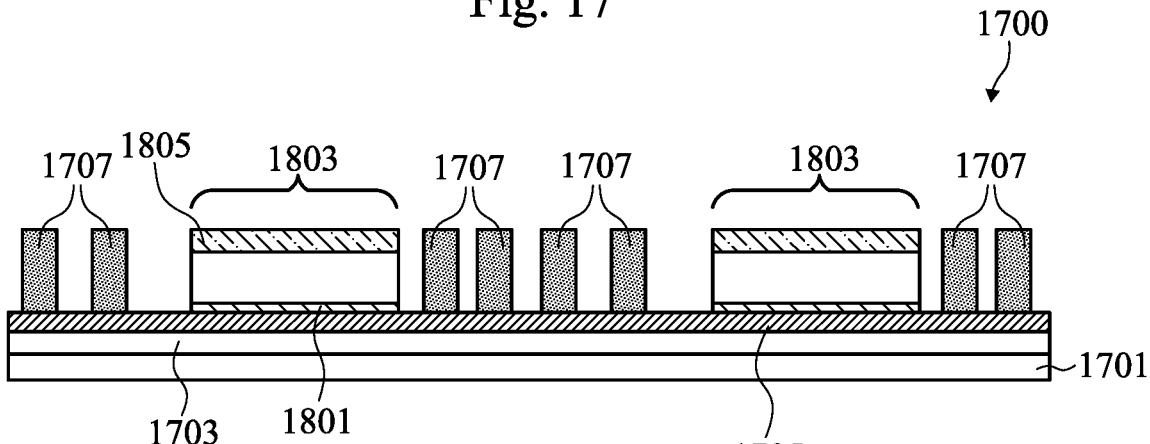

Referring to FIG. 18, semiconductor dies 1803 are attached to the one or more dielectric layers 1705 using adhesive layers 1801. In some embodiments, the semiconductor dies 1803 are placed on the one or more dielectric layers 1705 using, for example, a pick and place apparatus. In other embodiments, the semiconductor dies 1803 may be placed on the one or more dielectric layers 1705 manually, or using any other suitable method. In some embodiments, the semiconductor dies 1803 may be formed using similar method as the semiconductor dies 100, 600 or 1100 (see, for example, FIG. 1A-5B, 6A-10B, or 11A-15B) and the description is not repeated herein. In some embodiments, the adhesive layer 1801 may comprise an LTHC material, a UV adhesive, a die attach film, or the like, and may be formed using a spin-on coating process, a printing process, a lamination process, or the like.

Referring further to FIG. 18, the semiconductor dies 1803 comprise routing structures 1805 formed on device sides (front sides) of the semiconductor dies 1803. In some embodiments, the routing structures 1805 may be formed using similar methods as the routing structures 503, 1003 or 1503 (see, for example, FIG. 1A-5B, 6A-10B, or 11A-15B) and the description is not repeated herein.

Figure 19:
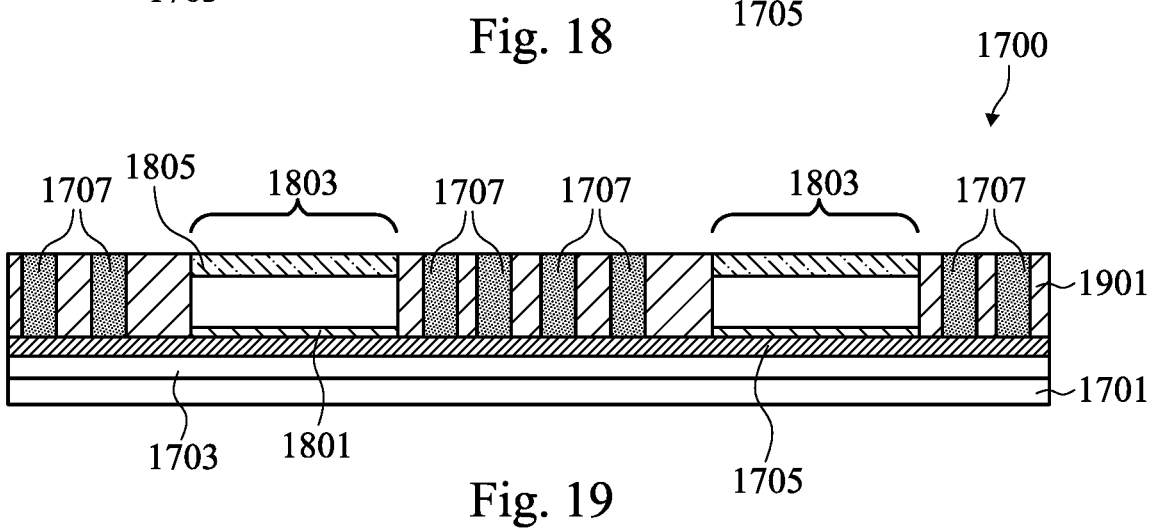

Referring to FIG. 19, an encapsulant 1901 is formed over the carrier 1701, and over and surrounding the semiconductor dies 1803 and the conductive vias 1707. In some embodiments, the encapsulant 1901 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the semiconductor dies 1803 and the conductive vias 1707.

Referring further to FIG. 19, in some embodiments, a resulting structure is planarized using a CMP, a grinding process, or the like. In some embodiment, the planarization process is performed until conductive pillars and conductive lines (not shown) of the routing structures 1805 are exposed. In some embodiments, the top surfaces of the conductive pillars and the conductive lines are substantially coplanar with top surfaces of the conductive vias 1707 and the encapsulant 1901.

Figure 20:
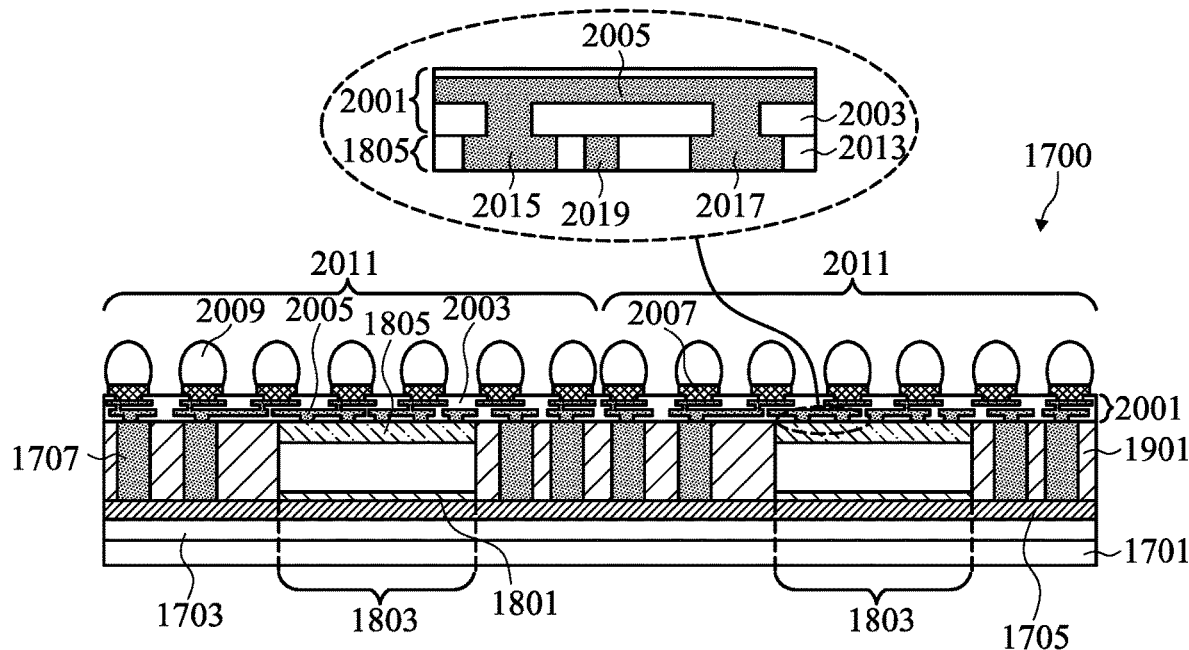

Referring to FIG. 20, one or more redistribution layers (RDLs) 2001 are formed over the semiconductor dies 1803, the conductive vias 1707 and the encapsulant 1901. In some embodiments, the RDLs 2001 comprise one or more dielectric layers 2003 and one or more conductive features 2005 disposed within the one or more dielectric layers 2003. In the illustrated embodiment, the one or more dielectric layers 2003 are formed using similar materials and methods as the buffer layer 201 (see, for example, FIGS. 2A and 2B) and the description is not repeated herein. In some embodiments, each of the one or more dielectric layers 2003 may be patterned to expose underlying conductive features. For example, a bottommost dielectric layer of the one or more dielectric layers 2003 is patterned to expose the conductive vias 1707 and the conductive features of the routing structures 1805. In some embodiment, the one or more dielectric layers 2003 comprising photo-patternable materials may be patterned using an acceptable photolithography technique. For example, the bottommost dielectric layer of the one or more dielectric layers 2003 is exposed to light and subsequently developed and/or cured.

Referring further to FIG. 20, a first conductive feature (not individually shown) of the one or more conductive features 2005 is formed over the bottommost dielectric layer of the one or more dielectric layers 2003. The first conductive feature may comprise various lines/traces (running "horizontally" across a top surface of the bottommost dielectric layer) and/or vias (extending "vertically" through the bottommost dielectric layer, and contacting the conductive vias 1707 and the conductive features of the routing structures 1805). In some embodiments, a seed layer (not shown) is deposited over the bottommost dielectric layer. The seed layer may comprise copper, titanium, nickel, gold, manganese, the like, or a combination thereof, and may be formed by ALD, PVD, sputtering, the like, or a combination thereof. Subsequently, a photoresist material (not shown) is deposited over the seed layer and patterned to define the desired pattern for the first conductive feature. A conductive material, such as copper, tungsten, aluminum, silver, gold, the like, or a combination thereof, is formed on the seed layer by an electro-chemical plating process, an electroless plating process, ALD, PVD, the like, or a combination thereof. Subsequently, the photoresist material is removed using appropriate photoresist stripping process, such as an ashing processes followed by a wet clean process. Exposed portions of the seed layer over the bottommost dielectric layer are removed using, for example, a suitable etching process. Subsequently, the process described above is applied to other dielectric layers of the one or more dielectric layers 2003 until formation of the RDLs 2001 is completed.

FIG. 20 further illustrates a blow up of an interface between the routing structure 1805, comprising a protective layer 2013, a first conductive pillar 2015, a second conductive pillar 2017 and a conductive line 2019, and the RDLs 2001. In some embodiments, the protective layer 2013, the first conductive pillar 2015, the second conductive pillar 2017 and the conductive line 2019 may be formed using similar materials and methods as the protective layer 501, the first conductive pillar 401, the second conductive pillar 403 and the conductive line 405 (see, for example, FIGS. 5A and 5B), respectively, and the description is not repeated herein. In the illustrated embodiment, the one or more conductive features of the RDLs are in contact with the first conductive pillar 2015 and the second conductive pillar 2017.

Referring further to FIG. 20, underbump metallizations (UBMs) 2007 are formed over and electrically coupled to the RDLs 2001. In some embodiments, a set of openings (not shown) may be formed through the topmost dielectric layer of the one or more dielectric layers 2003 to expose the one more conductive features 2005 of the RDLs 2001. The UBMs 2007 may extend through these openings in the topmost dielectric layer of the one or more dielectric layers 2003 and may also extend along a surface of the topmost dielectric layer of the one or more dielectric layers 2003. The UBMs 2007 may include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 2007. Any suitable materials or layers of material that may be used for the UBMs 2007 are fully intended to be included within the scope of the current application. FIG. 20 further illustrates the formation of connectors 2009 over and electrically coupled to the UBMs 2007. In some embodiments, the connectors 2009 may be solder balls, metal pillars, controlled collapse chip connection (C4) bumps, ball grid array (BGA) balls, micro bumps, electroless nickel-electroless palladium-immersion gold technique (ENEPIG) formed bumps, or the like. The connectors 2009 may include a conductive material such as solder, copper, aluminum, gold, nickel, silver, palladium, tin, the like, or a combination thereof. In some embodiments in which the connectors 2009 are solder bumps, the connectors 2009 are formed by initially forming a layer of solder through commonly used methods such as evaporation, electroplating, printing, solder transfer, ball placement, or the like. Once the layer of solder has been formed on the structure, a reflow may be performed in order to shape the material into the desired bump shapes. In other embodiments, the connectors 2009 may be metal pillars (such as a copper pillar) formed by a sputtering, printing, electro-chemical plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Referring further to FIG. 20, after forming the connectors 2009, the packaged semiconductor device 1700 is detached from the carrier 1701 and diced to form individual packages 2011. In some embodiments, the packaged semiconductor device 1700 may be diced by sawing, a laser ablation method, or the like. Subsequently, each of the packages 2011 may be tested to identify known good packages (KGPs) for further processing.

Figure 21:
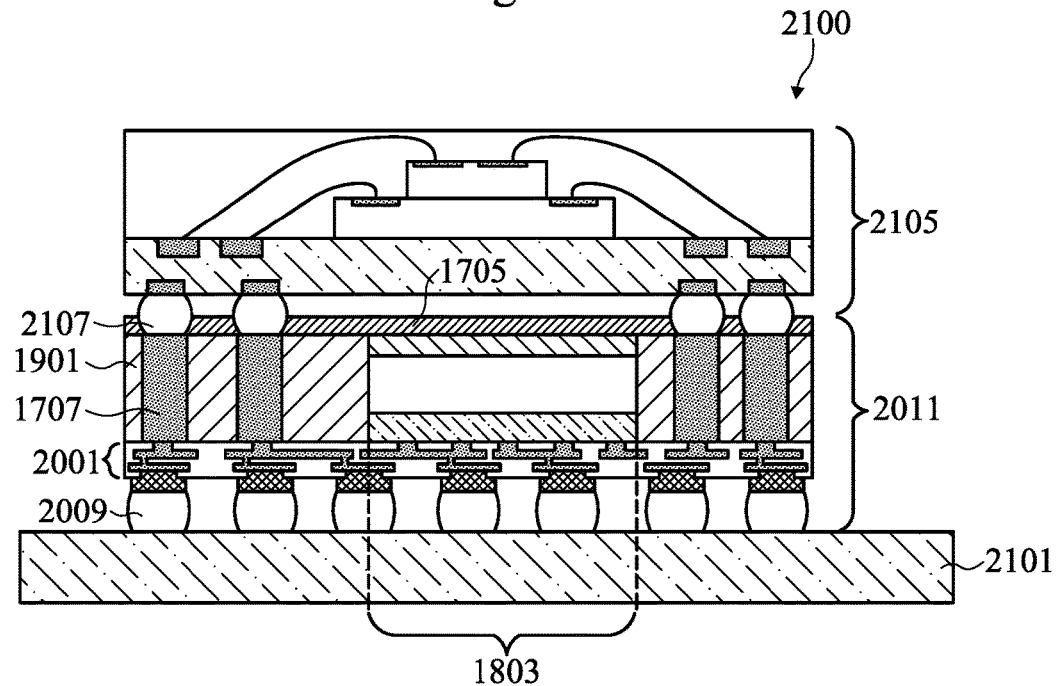

FIG. 21 illustrates a bonding process of a workpiece 2105 to the package 2011 with a set of connectors 2107 extending through openings in the one or more dielectric layers 1705 to form a stacked semiconductor device 2100. In some embodiments, the workpiece 2105 may be a package, one or more dies, a printed circuit board, an interposer, or the like. In some embodiments wherein the workpiece 2105 is a package, the stacked semiconductor device 2100 is a PoP device. In other embodiments wherein the workpiece 2105 is a die, the stacked semiconductor device 2100 is a CoP device. In some embodiments, the connectors 2107 may be formed using similar material and methods as the connectors 2009 (see, for example, FIG. 20) and the description is not repeated herein. In some embodiments, the workpiece 2105 may be bonded to the packaged semiconductor device 1700 prior to dicing the packaged semiconductor device 1700 into the packages 2011.

Referring further to FIG. 21, an underfill material (not shown) may be injected or otherwise formed in the space between the workpiece 2105 and the package 2011 and surrounding the connectors 2107. The underfill material may, for example, be a liquid epoxy, deformable gel, silicon rubber, or the like, that is dispensed between the structures, and then cured to harden. This underfill material is used, among other things, to reduce damage to and to protect the connectors 2107.

Referring further to FIG. 21, in some embodiments, the stacked semiconductor device 2100 may be bonded to a workpiece 2101 using the connectors 2009. In some embodiments, the workpiece 2101 may be similar to the workpiece 2105 and the description is not repeated herein. In the illustrated embodiment, the workpiece 2101 is a printed circuit board (PCB).

As described above in greater detail, a package (such as the package 2011) comprises a semiconductor die (such as the semiconductor die 1803) having a routing structure (such as the routing structure 1805) formed thereon. By forming the routing structure on the semiconductor die before forming one or more RDLs (such as the RDLs 2001), it is possible to advantageously simplify a structure of the RDLs. In some embodiments, the number of the RDLs may be reduced, which in turn may reduce parasitic contributions from eliminated layers of the RDLs.

Figure 22:
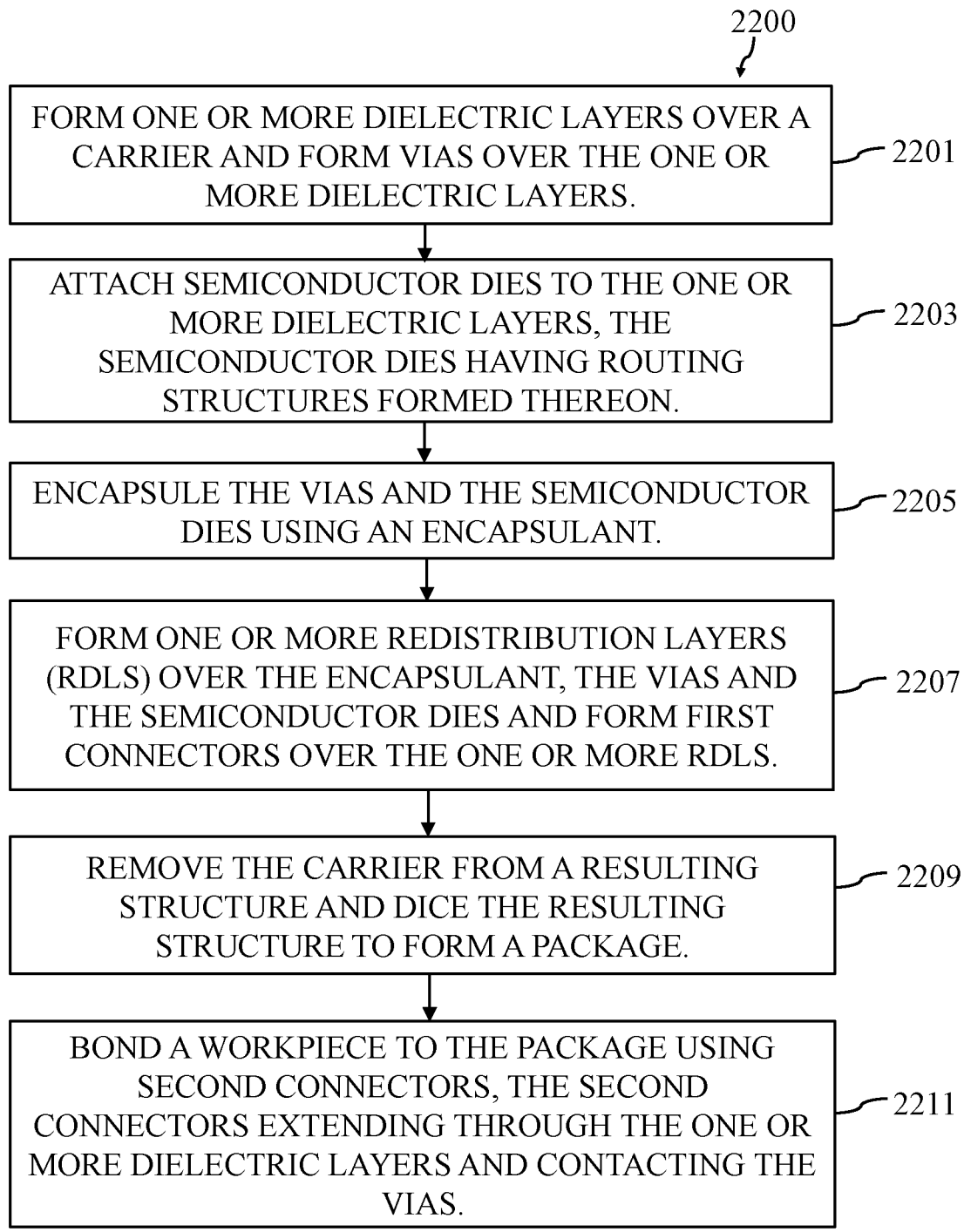
FIG. 22 is a flow diagram illustrating a method of forming a stacked semiconductor device in accordance with some embodiments.

FIG. 22 is a flow diagram illustrating a method 2200 of forming a stacked semiconductor device in accordance with some embodiments. The method 2200 starts with step 2201, wherein one or more dielectric layers (such as the one or more dielectric layers 1705) are formed over a carrier (such as the carrier 1701) as described above with reference to FIG. 17. Subsequently, conductive vias (such as the conductive vias 1707) are formed over the one or more dielectric layers as described above with reference to FIG. 17. In step 2203, semiconductor dies (such as the semiconductor dies 1803 formed using the method 1600) are attached to the one or more dielectric layers as described above with reference to FIG. 18. In some embodiments, the semiconductor dies comprise routing structures (such as the routing structures 1805 formed using the method 1600). In step 2205, an encapsulant (such as the encapsulant 1901) is formed to encapsulate the conductive vias and the semiconductor dies as described above with reference to FIG. 19. In step 2207, one or more redistribution layers (such as the RDLs 2001) are formed over the encapsulated semiconductor dies and the conductive vias as described above with reference to FIG. 20. Subsequently, first connectors (such as the connectors 2009) are formed over the one or more RDLs as described above with reference to FIG. 20. In Step 2209, the resulting structure is debonded from the carrier and diced to form a package (such as the package 2011) as described above with reference to FIG. 20. In step 2211, a workpiece (such as the workpiece 2105) is bonded to the package using second connectors (such as the connectors 2107), wherein the second connectors extent through the one or more dielectric layers and contact the conductive vias as described above with reference to FIG. 21.

According to an embodiment, a semiconductor device includes a die. The die includes contact pads thereon, and a routing structure over the contact pads. The routing structure includes a passivation layer over the contact pads, a buffer layer over the contact pads and the passivation layer, first conductive pillars over a first set of the contact pads, the first conductive pillars having first portions and second portions, the first portions extending through the passivation layer and the buffer layer, the first portions contacting the first set of the contact pads, the second portions extending over the buffer layer, and conductive lines over the buffer layer, the conductive lines connecting pairs of the first conductive pillars. The semiconductor device further includes an external connector structure over the routing structure, the routing structure electrically coupling the contact pads to the external connector structure.

According to another embodiment, a semiconductor device includes a die encapsulated by a molding structure. The die includes contact pads thereon, and a routing structure over the contact pads, the molding structure extending along sidewalls of the routing structure. The routing structure includes a passivation layer over the contact pads, the passivation layer having first openings exposing a first set of the contact pads and a second set of the contact pads, the first set of the contact pads being different from the second set of the contact pads, and a buffer layer over the contact pads and the passivation layer, the buffer layer having second openings exposing the second set of the contact pads. The routing structure further includes first conductive pillars contacting the first set of the contact pads, the first conductive pillars having first portions and second portions, the first portions being disposed in the first openings and the second portions extending above a topmost surface of the passivation layer, wherein each of the first conductive pillars is spaced apart from other conductive elements of the routing structure, second conductive pillars contacting the second set of the contact pads, the second conductive pillars having third portions and fourth portions, the third portions being disposed in the second openings, and the fourth portions extending above a topmost surface of the buffer layer, and conductive lines over the buffer layer, ends of the conductive lines terminating with the second conductive pillars. The semiconductor device further includes an external connector structure over the routing structure, the routing structure electrically coupling the contact pads to the external connector structure.

According to yet another embodiment, a method includes forming contact pads on a die. A passivation layer is blanket deposited over the contact pads. The passivation layer is patterned to form first openings, the first openings exposing the contact pads. A buffer layer is blanket deposited over the passivation layer and the contact pads. The buffer layer is patterned to form second openings, the second opening exposing a first set of the contact pads. First conductive pillars are formed in the second openings, topmost surfaces of the first conductive pillars being above a topmost surface of the buffer layer. Simultaneously with forming the first conductive pillars, conductive lines are formed over the buffer layer, ends of the conductive lines terminating with the first conductive pillars. An external connector structure is formed over the first conductive pillars and the conductive lines, the first conductive pillars electrically coupling the contact pads to the external connector structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a die disposed over a first substrate, the die comprising:
   a second substrate comprising an integrated circuit;
   contact pads disposed over the second substrate, the contact pads being electrically connected to the integrated circuit, the contact pads comprising a first contact pad, a second contact pad, and a third contact pad;
   conductive pillars disposed over and electrically connected to the contact pads, the conductive pillars comprising a first conductive pillar, a second conductive pillar, and a third conductive pillar;
   a conductive line over the second substrate, the conductive line being a continuous material with the first conductive pillar and the second conductive pillar, an upper surface of the conductive line being level with an upper surface of the first conductive pillar and an upper surface of the second conductive pillar;
   dielectric layers disposed over the second substrate, the dielectric layers disposed over and around the contact pads, the conductive pillars, and the conductive line;
   an encapsulant disposed over the first substrate and around lateral edges of the die; and
   a redistribution layer disposed over the die, the redistribution layer electrically connected to the conductive pillars.

2. The semiconductor device of claim 1, further comprising a conductive via disposed over the first substrate, wherein the conductive via is encapsulated in the encapsulant.

3. The semiconductor device of claim 1, wherein the dielectric layers comprise a passivation layer, a buffer layer, and a protective layer.

4. The semiconductor device of claim 3, wherein the passivation layer physically contacts a surface of the second substrate, sidewalls of the contact pads, and upper surfaces of the contact pads.

5. The semiconductor device of claim 4, wherein the buffer layer is disposed over and physically contacts a first upper surface of the first contact pad and a second upper surface of the second contact pad, wherein the first conductive pillar physically contacts the first upper surface of the first contact pad, and wherein the second conductive pillar physically contacts a second upper surface of the second contact pad.

6. The semiconductor device of claim 5, wherein a third upper surface of the third contact pad is free of the buffer layer.

7. The semiconductor device of claim 5, wherein a first portion of the buffer layer physically contacts the first contact pad and the second contact pad, wherein a second portion of the buffer layer physically contacts the third contact pad, and wherein the first portion and the second portion are displaced from one another.

8. The semiconductor device of claim 7, further comprising a fourth contact pad disposed over the second substrate, wherein the first portion of the buffer layer physically contacts a fourth upper surface of the fourth contact pad.

9. A semiconductor device, comprising:
an integrated circuit over a semiconductor substrate; and
a routing structure over the integrated circuit, the routing structure comprising:
- contact pads over and electrically connected to the integrated circuit, the contact pads comprising a first contact pad, a second contact pad, and a third contact pad;
- a passivation layer over and around the contact pads;
- a buffer layer over the passivation layer, the buffer layer physically contacting the contact pads through openings in the passivation layer;
- conductive pillars over the buffer layer, the conductive pillars physically contacting the contact pads through openings in the buffer layer;
- conductive lines disposed over the buffer layer, opposing ends of the conductive lines connecting pairs of the conductive pillars; and
- a protective layer over the buffer layer and around sidewalls of the conductive pillars.

10. The semiconductor device of claim 9, wherein the conductive pillars comprise a first conductive pillar and a second conductive pillar, wherein the conductive lines comprise a first conductive line connecting the first conductive pillar to the second conductive pillar, and wherein a first continuous portion of the buffer layer physically contacts the first conductive pillar, the second conductive pillar, and the first conductive line.

11. The semiconductor device of claim 10, wherein the conductive pillars comprise a third conductive pillar being displaced from the conductive lines, and wherein the first continuous portion of the buffer layer physically contacts the third conductive pillar.

12. The semiconductor device of claim 11, wherein the conductive pillars comprise a fourth conductive pillar and a fifth conductive pillar, wherein the conductive lines comprise a second conductive line connecting the fourth conductive pillar to the fifth conductive pillar, wherein a second continuous portion of the buffer layer physically contacts the fourth conductive pillar, the second conductive pillar, and the second conductive line, and wherein the second continuous portion of the buffer layer is displaced from the first continuous portion of the buffer layer.

13. The semiconductor device of claim 9, further comprising:
- a carrier substrate attached to the semiconductor substrate with an adhesive layer; and
- an encapsulant over the carrier substrate and around lateral edges of the semiconductor substrate.

14. The semiconductor device of claim 13, further comprising a conductive via over the carrier substrate and laterally displaced from the semiconductor substrate, wherein the encapsulant is around sidewalls of the conductive via.

15. The semiconductor device of claim 14, further comprising a redistribution layer over the routing structure and the conductive via, wherein the redistribution layer is electrically connected to the integrated circuit and the conductive via.

16. A semiconductor device, comprising:
- contact pads along a surface of a substrate, the contact pads comprising a first contact pad, a second contact pad, and a third contact pad, each of the contact pads having a first radius;
- conductive pillars over the contact pads, the conductive pillars comprising a first conductive pillar, a second conductive pillar, and a third conductive pillar, the first conductive pillar over and physically contacting the first contact pad, the second conductive pillar over and physically contacting the second contact pad, the third conductive pillar over and physically contacting the third contact pad, each of the conductive pillars having a second radius, the second radius being less than the first radius;
- a passivation layer along the surface of the substrate and along top surfaces of the contact pads, the top surfaces of the contact pads facing opposite of the substrate;
- a buffer layer along a top surface of the passivation layer, the top surface of the passivation layer facing opposite of the substrate, a first continuous portion of the buffer layer along a first top surface of the first contact pad and along a second top surface of the second contact pad, the first continuous portion of the buffer layer extending laterally beyond the first conductive pillar by a first distance, a sum of the second radius and the first distance being greater than the first radius; and
- conductive lines along a top surface of the buffer layer, the top surface of the buffer layer facing opposite of the substrate, the conductive lines being continuous with some of the conductive pillars.

17. The semiconductor device of claim 16, wherein the third contact pad is free of the buffer layer.

18. The semiconductor device of claim 16, wherein the first continuous portion of the buffer layer is along a third top surface of the third contact pad, wherein the first continuous portion of the buffer layer extends laterally beyond the third conductive pillar by the first distance.

19. The semiconductor device of claim 18, wherein a first conductive line of the conductive lines is continuous with the first conductive pillar and the second conductive pillar, wherein the first conductive line is displaced from the third conductive pillar by a second distance, and wherein the second distance is less than or equal to two times the first distance.

20. The semiconductor device of claim 16, wherein a second continuous portion of the buffer layer is along a third top surface of the third contact pad, and wherein the second continuous portion of the buffer layer extends laterally beyond the third conductive pillar by the first distance.

* * * * *